(12) United States Patent
Chou et al.

(10) Patent No.: US 12,291,479 B2
(45) Date of Patent: May 6, 2025

(54) TEXTURED GLASS ARTICLES AND METHODS OF MAKING THE SAME

(71) Applicant: CORNING INCORPORATED, Corning, NY (US)

(72) Inventors: Li-Wei Chou, Hsinchu (TW); Jiangwei Feng, Painted Post, NY (US); Jhih-Wei Liang, Toufen (TW)

(73) Assignee: CORNING INCORPORATED, Corning, NY (US)

( * ) Notice: Subject to any disclaimer, the term of this patent is extended or adjusted under 35 U.S.C. 154(b) by 493 days.

(21) Appl. No.: 17/632,831

(22) PCT Filed: Aug. 6, 2020

(86) PCT No.: PCT/US2020/045086
§ 371 (c)(1),
(2) Date: Feb. 4, 2022

(87) PCT Pub. No.: WO2021/030122
PCT Pub. Date: Feb. 18, 2021

(65) Prior Publication Data
US 2022/0267196 A1 Aug. 25, 2022

Related U.S. Application Data

(60) Provisional application No. 62/886,109, filed on Aug. 13, 2019.

(51) Int. Cl.
*C03C 15/00* (2006.01)
*H05K 5/03* (2006.01)
*H05K 5/00* (2006.01)

(52) U.S. Cl.
CPC .............. *C03C 15/00* (2013.01); *H05K 5/03* (2013.01); *H05K 5/0017* (2013.01)

(58) Field of Classification Search
CPC ...................................................... C03C 15/00
See application file for complete search history.

(56) References Cited

U.S. PATENT DOCUMENTS 4,865,877 A 9/1989 Yamaguchi et al.
6,348,159 B1 * 2/2002 Dapkus ..................... C23F 1/08
257/E21.309

(Continued)

FOREIGN PATENT DOCUMENTS

CN 104603077 A 5/2015
CN 104684859 A 6/2015

(Continued)

OTHER PUBLICATIONS

International Search Report and Written Opinion of the International Searching Authority; PCT/US2020/045086; dated Oct. 28, 2020; pp. 11; European Patent Office.

(Continued)

*Primary Examiner* — Cynthia Szewczyk

(57) ABSTRACT

A method is described herein of making a textured glass article, the method includes: etching an initial primary surface of a glass substrate having a thickness with a hydrofluoric acid-free etchant having a pH of about 3 or less; and removing the etchant from the glass substrate, such that the etching is conducted from above ambient temperature to about 100° C. to form a textured region that is defined by a primary surface of the substrate and comprises a sparkle of 2% or less, and the etching comprises a plurality of batch cycles.

18 Claims, 13 Drawing Sheets

(56) References Cited

U.S. PATENT DOCUMENTS

| | | |
|---|---|---|
| 8,771,532 B2 | 7/2014 | Carlson et al. |
| 8,992,786 B2 | 3/2015 | Kohli et al. |
| 9,411,180 B2 | 8/2016 | Gollier et al. |
| 2008/0210660 A1* | 9/2008 | Stockum ............... C09K 13/04 216/101 |
| 2010/0246016 A1 | 9/2010 | Carlson et al. |
| 2011/0267697 A1 | 11/2011 | Kohli et al. |
| 2015/0136736 A1 | 5/2015 | Jin et al. |
| 2018/0282201 A1* | 10/2018 | Hancock, Jr. ........... C03C 17/32 |

FOREIGN PATENT DOCUMENTS

| | | |
|---|---|---|
| JP | 06-330354 A | 11/1994 |
| WO | 2015/013360 A1 | 1/2015 |
| WO | 2018/182996 A1 | 10/2018 |
| WO | 2019/055745 A1 | 3/2019 |

OTHER PUBLICATIONS

A. M. N. Silva et al, "Iron(III) citrate speciation in aqueous solution", Dalton Trans., 2009, vol. 40, pp. 8616-8625.

Bunker, "Molecular mechanisms for corrosion of silica and silicate glasses", Journal of Non-Crystalline Solids, vol. 179, 1994, pp. 300-308.

D. D. Perrin, Dissociation constants of inorganic acids and bases in aqueous solution, London, Butterworths, 1969, pp. 1-104.

E. Estragnat et al., "Experimental investigation on mechanisms of silicon chemical mechanical polishing", Journal of Electronic Materials, 2004, vol. 33, No. 4, pp. 334-339.

Geisler, "The mechanism of borosilicate glass corrosion revisited", Geochimica et Cosmochimica Acta, vol. 158, 2015, pp. 112-129.

O. Oriekhova, et al., "Investigation of FeCl3 induced coagulation processes using electrophoretic measurement, nanoparticle tracking analysis and dynamic light scattering: Importance of pH and colloid surface charge", Colloids and Surfaces A: Physicochem. Eng. Aspects, 2014, vol. 461, pp. 212-219.

R. N. Goldberg et al, "Thermodynamic Quantities for the Ionization Reactions of Buffers", J. Phys. Chem. Ref. Data. 2002, vol. 31, pp. 231-370.

Chinese Patent Application No. 202080057474.3, Office Action dated Jul. 7, 2023, 5 pages (English Translation only), Chinese Patent Office.

\* cited by examiner

FeCl₃ dissociation

$$FeCl_3 \cdot 6H_2O + H_2O \rightleftharpoons [Fe(H_2O)_6]^{3+} + 3Cl^-$$

Iron(III) Chloride Hexahydrate — Abb. as $Fe^{3+}$

$Fe^{3+}$ Hydrolysis Reactions:

$$[Fe(H_2O)_6]^{3+} + H_2O \rightleftharpoons [Fe(H_2O)_5(OH)]^{2+} + H_3O^+$$

Abb. as $Fe(OH)^{2+}$ $$Fe(OH)^{2+} + H_2O \rightleftharpoons [Fe(H_2O)_4(OH)_2]^+ + H_3O^+$$

Abb. as $Fe(OH)_2^+$

FIG. 6C

|  | Early batch |  | Middle batch |  | Last batch |  |
|---|---|---|---|---|---|---|
| | B2 (L) | B2 (L+E) | B3 (L) | B3 (L+E) | B4 (L) | B4 (L+E) |
| | Ra=3.6 nm | Ra=39.5nm H=17.9% | 3.5 | 28.5 9.6% | 0.6 | 10 1.3% |
| | B2 (L) | B2 (L+E) | B3 (L) HCl+40mL | B3 (L+E) | B4 (L) HCl+40mL | B4 (L+E) |
| | Ra=5.9 nm | Ra=49.6nm H=21.4% | 3.7 | 84.5 61.1% | 18.0 | 19.2 3.4% |
| | B2 (L) | B2 (L+E) | B5 (L) HCl+40mL | B5 (L+E) | B6 (L) HCl+40mL | B6 (L+E) |
| | Ra=7.1 nm | Ra=58.0nm H=29.0% | 7.2 | 58.6 29.0% | 1.0 | 3.1 0.1% |
| | B2 (L) | B2 (L+E) | B4 (L) HCl+40mL | B4 (L+E) | B7 (L) HCl+40mL | B7 (L+E) |
| | Ra=5.5 nm | Ra=42.3nm H=17.7% | 5.7 | 35.0 12.8% | 1.3 | 10.3 1.4% |

FIG. 8B

| HCl (37%) Spiking amount | HCl (g) | M (mol/L) | Cal. pH | Max Batch cycles |
|---|---|---|---|---|
| 40.0 | 14.8 | 0.57 | 0.25 | 3 |
| 8.0 | 3.0 | 0.11 | 0.96 | 4 |
| 4.0 | 1.5 | 0.06 | 1.22 | 5 |
| 2.0 | 0.7 | 0.03 | 1.52 | 6 |

TEXTURED GLASS ARTICLES AND METHODS OF MAKING THE SAME

CLAIM OF PRIORITY

This application claims the benefit of priority under 37 U.S.C. § 371 to International Patent Application No. PCT/US2020/045086, filed Aug. 6, 2020, which claims the benefit of priority under 35 U.S.C. § 119 of U.S. Provisional Application No. 62/886,109, filed on Aug. 13, 2019, the contents of these documents are incorporated herein by reference in their entirety.

FIELD

The present disclosure generally relates to textured glass articles and methods of making the same, particularly hydrofluoric acid-free methods to produce substantially transparent, low sparkle, textured glass articles.

BACKGROUND

Antiglare surfaces are often used in display devices such as LCD screens, OLEDs and touch screens to avoid or reduce specular reflection of ambient light. In many display devices, these antiglare surfaces are formed by providing a level of roughness to one or more surfaces of the glass to spread and scatter incident light. Antiglare surfaces in the form a roughened glass surface are often used on the front surfaces of these display devices to reduce the apparent visibility of external reflections from the display and improve readability of the display under differing lighting conditions. These roughened surfaces are also employed in some display device applications, particularly touch screens, to improve tactile feeling.

Display "sparkle" or "dazzle" is a phenomenon that can occur when antiglare or light scattering surfaces are incorporated into a display system. Sparkle is associated with a very fine grainy appearance that can appear to have a shift in the pattern of the grains with changing viewing angle of the display. This type of sparkle is observed when pixelated displays, such as LCDs, are viewed through an antiglare surface. As the resolution of display devices continues to increase, particularly for handheld electronic devices, the pixel pitch of the array of pixels employed in these devices continues to decrease, exacerbating unwanted sparkle effects.

Conventional approaches to making textured glass surfaces often use treatments that employ aggressive acids (e.g., hydrofluoric acid), that are not environmentally friendly, costly to employ in manufacturing, and may result in relatively large features, limiting the effectiveness of these surfaces in minimizing sparkle. Other conventional approaches to creating antiglare surfaces employ additional coatings, which can increase manufacturing cost and produce unwanted optical effects.

In view of these considerations, there is a need for textured glass articles with smaller features and methods of making the same, particularly novel hydrofluoric acid-free methods to produce substantially transparent, low sparkle, textured glass articles.

SUMMARY

In some embodiments, a method of making a textured glass article, comprises: etching an initial primary surface of a glass substrate having a thickness with a hydrofluoric acid-free etchant having a pH of about 3 or less; and removing the etchant from the glass substrate, wherein: the etching is conducted from above ambient temperature to about 100° C. to form a textured region that is defined by a primary surface of the substrate and comprises a sparkle of 2% or less, and the etching comprises a plurality of batch cycles.

In one aspect, which is combinable with any of the other aspects or embodiments, the hydrofluoric acid-free etchant comprises: at least one of hydrochloric acid (HCl), citric acid, or iron (III) chloride hexahydrate.

In one aspect, which is combinable with any of the other aspects or embodiments, the step of etching comprises an additive salt used with the hydrofluoric acid-free etchant.

In one aspect, which is combinable with any of the other aspects or embodiments, the additive salt comprises one or more cations selected from the group consisting of $NH_4^+$, $Al^{3+}$, $Fe^{3+}$, $Ca^{2+}$ and $Mg^{2+}$.

In one aspect, which is combinable with any of the other aspects or embodiments, the hydrofluoric acid-free etchant is spiked with hydrochloric acid (HCl) after a second of the plurality of batch cycles.

In one aspect, which is combinable with any of the other aspects or embodiments, the spiking comprises at least 0.25 vol. % HCl by total volume of etchant.

In one aspect, which is combinable with any of the other aspects or embodiments, the hydrofluoric acid-free etchant is spiked with citric acid.

In one aspect, which is combinable with any of the other aspects or embodiments, the spiking comprises at least 1.8 wt. % citric acid by total volume of etchant.

In one aspect, which is combinable with any of the other aspects or embodiments, a transmission haze of the glass substrate with citric acid spiking is greater than a transmission haze of the glass substrate without citric acid spiking after two batch cycles.

In one aspect, which is combinable with any of the other aspects or embodiments, the hydrofluoric acid-free etchant is spiked with iron (III) chloride hexahydrate.

In one aspect, which is combinable with any of the other aspects or embodiments, the spiking comprises at least 3.5 wt. % iron (III) chloride hexahydrate by total volume of etchant.

In one aspect, which is combinable with any of the other aspects or embodiments, a transmission haze of the glass substrate with iron (III) chloride hexahydrate spiking is greater than a transmission haze of the glass substrate without iron (III) chloride hexahydrate spiking after two batch cycles.

In one aspect, which is combinable with any of the other aspects or embodiments, the etching comprises at least six batch cycles.

In one aspect, which is combinable with any of the other aspects or embodiments, the step of etching comprises: a first etching step to form an interim textured glass substrate having a first leached layer with a plateaued top surface; and a second etching step to form a secondary textured glass substrate having a second leached layer with a plurality of exposed features, wherein the plurality of exposed features have a first average feature size and a first average roughness.

In one aspect, which is combinable with any of the other aspects or embodiments, the plurality of exposed features comprise a plurality of peaks and valleys; the first average feature size is a distance between adjacent peaks in a range of less than about 10 μm; and the first average roughness is a peak-to-valley distance in a range of 1 nm to 1000 nm.

In one aspect, which is combinable with any of the other aspects or embodiments, the method further comprises: removing the second leached layer to form the textured glass article having a second average feature size and a second average roughness, wherein the second average feature size and the second average roughness is substantially equivalent to the first average feature size and the first average roughness.

In one aspect, which is combinable with any of the other aspects or embodiments, the glass substrate comprises a bulk composition at the midpoint of the thickness comprising about 40 mol % to 80 mol % silica and the textured region comprises a textured region composition comprising at least about 40 mol % silica.

In one aspect, which is combinable with any of the other aspects or embodiments, the textured region composition comprises a higher amount of silica than the silica in the bulk composition.

In one aspect, which is combinable with any of the other aspects or embodiments, a consumer electronic product, comprises: a housing having a front surface, a back surface and side surfaces; electrical components provided at least partially within the housing, the electrical components including at least a controller, a memory, and a display, the display being provided at or adjacent the front surface of the housing; and a cover glass disposed over the display, wherein at least one of a portion of the housing or the cover glass is formed by any methods described herein.

Additional features and advantages will be set forth in the detailed description which follows and will be readily apparent to those skilled in the art from that description or recognized by practicing the embodiments as described herein, including the detailed description which follows, the claims, as well as the appended drawings.

It is to be understood that both the foregoing general description and the following detailed description are merely exemplary and are intended to provide an overview or framework to understanding the nature and character of the disclosure as it is claimed.

The accompanying drawings are included to provide a further understanding of principles of the disclosure, and are incorporated in, and constitute a part of, this specification. The drawings illustrate one or more embodiment(s) and, together with the description, serve to explain, by way of example, principles and operation of the disclosure. It is to be understood that various features of the disclosure disclosed in this specification and in the drawings can be used in any and all combinations. By way of non-limiting examples, the various features of the disclosure may be combined with one another according to the following aspects.

BRIEF DESCRIPTION OF THE DRAWINGS

These and other features, aspects and advantages of the present disclosure are better understood when the following detailed description of the disclosure is read with reference to the accompanying drawings, in which:

FIG. 6C illustrates $FeCl_3$ dissociation in water and $Fe_3^+$ hydrolysis reactions, according to some embodiments.

FIG. 8B illustrates AFM imaged surfaces from as-leached and post-etching treatments in early, middle and last batches. B2(L), B3(L), B4(L), B5(L), B6(L), and B7(L) represent as-leached surface in the 2nd, 3nd, 4th, 5th, 6th, and 7th batches, respectively, and B2(L+E), B3(L+E), B4(L+E), B5(L+E), B6(L+E), and B7(L+E) represent as-leached and post-etching in the 2nd, 3nd, 4th, 5th, 6th, and 7th batches, respectively, according to some embodiments.

DETAILED DESCRIPTION

Figure 1A:
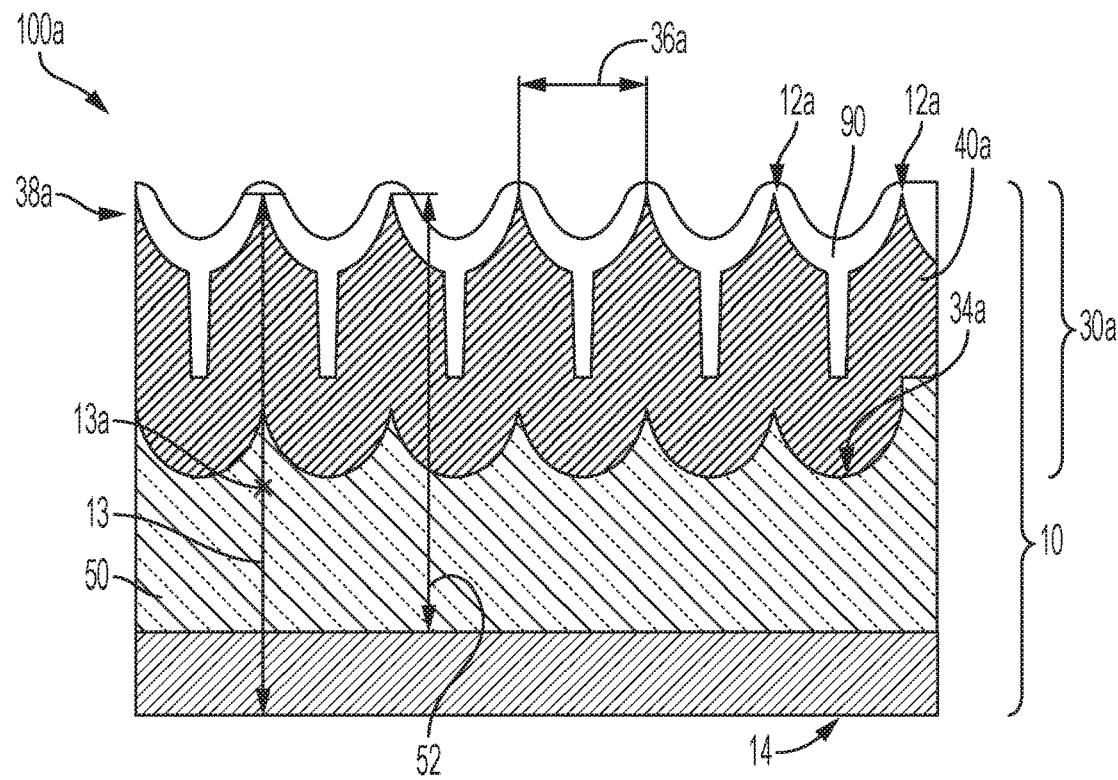
FIGS. 1A and 1B are cross-sectional, schematic views of textured glass articles comprising: a textured region with a textured region composition comprising a higher amount of silica than silica in the bulk composition (FIG. 1A) and a textured region with a textured region composition comprising a substantially equivalent amount of silica as contained in the bulk composition (FIG. 1B), according to some embodiments.

In the following detailed description, for purposes of explanation and not limitation, example embodiments disclosing specific details are set forth to provide a thorough understanding of various principles of the present disclosure. However, it will be apparent to one having ordinary skill in the art, having had the benefit of the present disclosure, that the present disclosure may be practiced in other embodiments that depart from the specific details disclosed herein. Moreover, descriptions of well-known devices, methods and materials may be omitted so as not to obscure the description of various principles of the present disclosure. Finally, wherever applicable, like reference numerals refer to like elements.

Ranges can be expressed herein as from "about" one particular value, and/or to "about" another particular value. When such a range is expressed, another embodiment includes from the one particular value and/or to the other particular value. Similarly, when values are expressed as approximations, by use of the antecedent "about," it will be understood that the particular value forms another embodiment. It will be further understood that the endpoints of each of the ranges are significant both in relation to the other endpoint, and independently of the other endpoint.

Directional terms as used herein—for example up, down, right, left, front, back, top, bottom—are made only with reference to the figures as drawn and are not intended to imply absolute orientation.

Unless otherwise expressly stated, it is in no way intended that any method set forth herein be construed as requiring that its steps be performed in a specific order. Accordingly, where a method claim does not actually recite an order to be followed by its steps, or it is not otherwise specifically stated in the claims or descriptions that the steps are to be limited to a specific order, it is in no way intended that an order be inferred, in any respect. This holds for any possible non-express basis for interpretation, including: matters of logic with respect to arrangement of steps or operational flow; plain meaning derived from grammatical organization or punctuation; the number or type of embodiments described in the specification.

As used herein, the singular forms "a," "an" and "the" include plural referents unless the context clearly dictates otherwise. Thus, for example, reference to a "component" includes aspects having two or more such components, unless the context clearly indicates otherwise.

In some implementations, roughness may be broadly defined as half of a peak-to-valley distance.

Aspects of the disclosure generally pertain to textured glass articles and, particularly, transparent textured glass articles with low sparkle. Aspects of the disclosure include methods of making these articles, particularly with hydrofluoric acid-free processes. More generally, the approaches to preparing the textured glass articles of the disclosure generate finely textured surfaces with features of less than 5 microns on multi-component glass substrates with compositions that comprise appreciable amounts of silica and one or more additional components. In general, the heterogeneous nature of the glass substrate allows it to be selectively etched with one or more hydrofluoric acid-free etchants, leaving a porous silica-rich layer that can serve as the textured region for the textured glass article. Additional process steps can be employed to remove the porous-silica rich layer, leaving a textured surface with a composition comparable to the bulk composition of the substrate for the textured glass article.

Referring to FIG. 1A, a textured glass article 100a is depicted as including a glass substrate 10 with a plurality of primary surfaces 12a and 14, a thickness 13 and a bulk composition at about the midpoint 13a of the thickness 13. In some embodiments, the bulk composition comprises about 40 mol % to 80 mol % silica. The glass article 100a also includes a textured region 30a with a composition having at least 40 mol % silica. In some embodiments, the textured region 30a is formed from or otherwise part of the substrate 10, as shown in FIG. 1A. In such implementations, the textured region 30a is defined between the primary surface 12a and a textured region interface 34a within the substrate 10. In other implementations (not shown), the textured region 30a is present over the substrate 10, with the interface 34a residing between the textured region 30a and the substrate 10.

As generally depicted in FIG. 1A, the textured region 30a includes a plurality of exposed features on its primary surface 12a with an average feature size 36a and an average roughness 38a. According to some implementations of the textured glass article 100a, the exposed features of the textured region 30a, including their average feature size 36a and average roughness 38a, are configured to reduce the level of glare associated with article when it is employed in a display device. The average feature size 36a is given by an average of the maximum dimension of a sampling of features associated with the textured region 30a, measured according to analytical techniques as understood by those with ordinary skill in the field of this disclosure, for example, by taking an image of primary surface 12a with an atomic force microscope at 200× magnification and measuring the maximum dimension of a sampling of at least ten (10) features. Accordingly, the terms "average feature size" and "average maximum dimension" are used interchangeably in the disclosure. In some embodiments, at least some of the plurality of features have a peak and a valley. The "maximum dimension" of the exposed features is the greatest distance from one portion of a peak of a feature to another portion of the peak of the feature. In embodiments, the average feature size 36a associated with the textured region 30a of the article 100a is less than about 10 microns. According to some implementations, the average feature size 36a associated with the textured region 30a is less than about 5 microns, less than about 1 micron, or less than about 0.5 microns in some cases. Further, the average feature size 36a can be less than about 10 microns, 9 microns, 8 microns, 7 microns, 6 microns, 5 microns, 4 microns, 3 microns, 2 microns, 1 micron, 0.9 microns, 0.8 microns, 0.7 microns, 0.6 microns, 0.5 microns, 0.4 microns, 0.3 microns, 0.2 microns, 0.1 microns, and all values between these upper limits.

Referring again to the textured region 30a associated with the textured glass article 100a depicted in FIG. 1A, the average roughness 38a can be measured as surface roughness, $R_a$, using an interferometer and a sample area of 200 microns by 200 microns. The interferometer used was a ZYGO® NEWVIEW™ 7300 Optical Surface Profiler manufactured by ZYGO® Corporation. The surface roughness is reported as a mean surface roughness. In embodiments, the glass article 100a can employ a textured region 30a having an average roughness 38a from about 10 nanometers to about 500 nanometers ($R_a$). According to some implementations, the average roughness 38a associated with the textured region 30a is from about 10 nanometers to about 500 nanometers ($R_a$), from about 20 nanometers to about 400 nanometers ($R_a$), from about 30 nanometers to about 300 nanometers ($R_a$), and all values between these levels of surface roughness. Further, in some implementations of the textured glass article 100a, the textured region 30a possesses an average roughness 38a from about 0.1 nanometers to about 300 nanometers ($R_a$), and all values between these levels of surface roughness.

When a textured region of a glass article has a relatively low spatial frequency, the roughness associated with its exposed features can begin to act like a plurality of lenses that generates an image artifact called "sparkle." Display "sparkle" or "dazzle" is a generally undesirable side effect that can occur when introducing antiglare or light scattering surfaces into a pixelated display system such as, for example, a LCD, an OLED, touch screens, or the like, and differs in type and origin from the type of "sparkle" or "speckle" that has been observed and characterized in projection or laser systems. Sparkle is associated with a very fine grainy appearance of the display and may appear to have a shift in the pattern of the grains with changing viewing angle of the display. Display sparkle may be manifested as bright and dark or colored spots at approximately the pixel-level size scale.

As used herein, the terms "pixel power deviation" and "PPD" refer to the quantitative measurement for display sparkle. Further, as used herein, the term "sparkle" is used interchangeably with "pixel power deviation" and "PPD." PPD is calculated by image analysis of display pixels according to the following procedure. A grid box is drawn around each LCD pixel. The total power within each grid box is then calculated from CCD camera data and assigned as the total power for each pixel. The total power for each LCD pixel thus becomes an array of numbers, for which the mean and standard deviation may be calculated. The PPD value is defined as the standard deviation of total power per pixel divided by the mean power per pixel (times 100). The total power collected from each LCD pixel by the eye simulator camera is measured and the standard deviation of total pixel power (PPD) is calculated across the measurement area, which typically comprises about 30×30 LCD pixels.

The details of a measurement system and image processing calculation that are used to obtain PPD values are described in U.S. Pat. No. 9,411,180 entitled "Apparatus and Method for Determining Sparkle," the contents of which that is related to PPD measurements is incorporated by reference herein in its entirety. The PPD measurement system includes: a pixelated source comprising a plurality of pixels, wherein each of the plurality of pixels has referenced indices i and j; and an imaging system optically disposed along an optical path originating from the pixelated source. The imaging system comprises: an imaging device disposed along the optical path and having a pixelated sensitive area comprising a second plurality of pixels, wherein each of the second plurality of pixels are referenced with indices m and n; and a diaphragm disposed on the optical path between the pixelated source and the imaging device, wherein the diaphragm has an adjustable collection angle for an image originating in the pixelated source. The image processing calculation includes: acquiring a pixelated image of the transparent sample, the pixelated image comprising a plurality of pixels; determining boundaries between adjacent pixels in the pixelated image; integrating within the boundaries to obtain an integrated energy for each source pixel in the pixelated image; and calculating a standard deviation of the integrated energy for each source pixel, wherein the standard deviation is the power per pixel dispersion. As used herein, all "PPD" and "sparkle" values, attributes and limits are calculated and evaluated with a test setup employing a display device having a pixel density of 210 pixels per inch (PPI).

As generally depicted in FIG. 1A, the textured region 30a of the textured glass article 100a can be configured to minimize sparkle. In some embodiments, the textured region 30a is configured to minimize sparkle, while maintaining a reduced glare function suitable for display device applications. According to some embodiments, the textured region 30a of the textured glass article 100a is configured such that the article is characterized by a sparkle of 2% or less. In other aspects, the textured glass articles 100a of the disclosure can be configured with a sparkle of 2% or less, 1.5% or less, 1% or less, 0.5% or less, and all sparkle levels between these upper limits.

Referring again to FIG. 1A, the glass substrate 10 of the textured glass article 100a is configured with a multi-component glass composition having about 40 mol % to 80 mol % silica and a balance of one or more other constituents, e.g., alumina, calcium oxide, sodium oxide, boron oxide, etc. In some implementations, the bulk composition of the glass substrate 10 is selected from the group consisting of aluminosilicate glass, a borosilicate glass and a phosphosilicate glass. In other implementations, the bulk composition of the glass substrate 10 is selected from the group consisting of aluminosilicate glass, a borosilicate glass, a phosphosilicate glass, a soda lime glass, an alkali aluminosilicate glass, and an alkali aluminoborosilicate glass. In further implementations, the glass substrate 10 is a glass-based substrate, including but not limited to, glass-ceramic materials that comprise a glass component at about 90% or greater by weight and a ceramic component.

In one embodiment of the textured glass article 100a, the glass substrate 10 has a bulk composition that comprises an alkali aluminosilicate glass that comprises alumina, at least one alkali metal and, in some embodiments, greater than 50 mol %, $SiO_2$, in other embodiments, at least 58 mol %, and in still other embodiments, at least 60 mol % $SiO_2$, wherein the ratio ($Al_2O_3$ (mol %)+$B_2O_3$ (mol %))/Σ alkali metal modifiers (mol %)>1, where the modifiers are alkali metal oxides. This glass, in particular embodiments, comprises, consists essentially of, or consists of: about 58 mol % to about 72 mol % $SiO_2$; about 9 mol % to about 17 mol % $Al_2O_3$; about 2 mol % to about 12 mol % $B_2O_3$; about 8 mol % to about 16 mol % $Na_2O$; and 0 mol % to about 4 mol % $K_2O$, wherein the ratio ($Al_2O_3$ (mol %)+$B_2O_3$ (mol %))/Σ alkali metal modifiers (mol %)>1, where the modifiers are alkali metal oxides.

In another embodiment of the textured glass article 100a, as shown in FIG. 1A, the glass substrate 10 has a bulk composition that comprises an alkali aluminosilicate glass comprising, consisting essentially of, or consisting of: about 61 mol % to about 75 mol % $SiO_2$; about 7 mol % to about 15 mol % $Al_2O_3$; 0 mol % to about 12 mol % $B_2O_3$; about 9 mol % to about 21 mol % $Na_2O$; 0 mol % to about 4 mol % $K_2O$; 0 mol % to about 7 mol % MgO; and 0 mol % to about 3 mol % CaO.

In yet another embodiment, the glass substrate 10 has a bulk composition that comprises an alkali aluminosilicate glass comprising, consisting essentially of, or consisting of: about 60 mol % to about 70 mol % $SiO_2$; about 6 mol % to about 14 mol % $Al_2O_3$; 0 mol % to about 15 mol % $B_2O_3$; 0 mol % to about 15 mol % $Li_2O$; 0 mol % to about 20 mol % $Na_2O$; 0 mol % to about 10 mol % $K_2O$; 0 mol % to about 8 mol % MgO; 0 mol % to about 10 mol % CaO; 0 mol % to about 5 mol % $ZrO_2$; 0 mol % to about 1 mol % $SnO_2$; 0 mol % to about 1 mol % $CeO_2$; less than about 50 ppm $As_2O_3$; and less than about 50 ppm $Sb_2O_3$; wherein 12 mol %≤$Li_2O+Na_2O+K_2O$≤20 mol % and 0 mol %≤MgO+Ca≤10 mol %.

In still another embodiment, the glass substrate 10 has a bulk composition that comprises an alkali aluminosilicate glass comprising, consisting essentially of, or consisting of: about 64 mol % to about 68 mol % $SiO_2$; about 12 mol % to about 16 mol % $Na_2O$; about 8 mol % to about 12 mol % $Al_2O_3$; 0 mol % to about 3 mol % $B_2O_3$; about 2 mol % to about 5 mol % $K_2O$; about 4 mol % to about 6 mol % MgO; and 0 mol % to about 5 mol % CaO, wherein: 66 mol %≤$SiO_2+B_2O_3$+CaO≤69 mol %; $Na_2O+K_2O+B_2O_3$+MgO+CaO+SrO>10 mol %; 5 mol %≤MgO+CaO+SrO≤8 mol %; ($Na_2O+B_2O_3$)—$Al_2O_3$≤2 mol %; 2 mol %≤$Na_2O$—$Al_2O_3$≤6 mol %; and 4 mol %≤($Na_2O+K_2O$)—$Al_2O_3$≤10 mol %.

In other embodiments, the glass substrate 10 has a bulk composition that comprises $SiO_2$, $Al_2O_3$, $P_2O_5$, and at least one alkali metal oxide ($R_2O$), wherein 0.75>[($P_2O_5$ (mol %)+$R_2O$ (mol %))/$M_2O_3$ (mol %)]≤1.2, where $M_2O_3$=$Al_2O_3$+$B_2O_3$. In some embodiments, [($P_2O_5$ (mol %)+$R_2O$ (mol %))/$M_2O_3$ (mol %)]=1 and, in some embodiments, the glass does not include $B_2O_3$ and $M_2O_3$=$Al_2O_3$. The glass substrate comprises, in some embodiments: about 40 to about 70 mol % $SiO_2$; 0 to about 28 mol % $B_2O_3$; about 0 to about 28 mol % $Al_2O_3$; about 1 to about 14 mol % $P_2O_5$; and about 12 to about 16 mol % $R_2O$. In some embodiments, the glass substrate comprises: about 40 to about 64 mol % $SiO_2$; 0 to about 8 mol % $B_2O_3$; about 16 to about 28 mol % $Al_2O_3$; about 2 to about 12 mol % $P_2O_5$; and about 12 to about 16 mol % $R_2O$. The glass substrate 10 may further comprise at least one alkaline earth metal oxide such as, but not limited to, MgO or CaO.

In some embodiments, the glass substrate 10 has a bulk composition that is substantially free of lithium; i.e. the glass comprises less than 1 mol % $Li_2O$ and, in other embodiments, less than 0.1 mol % $Li_2O$ and, in other embodiments, 0.01 mol % $Li_2O$, and in still other embodiments, 0 mol % $Li_2O$. In some embodiments, such glasses are free of at least one of arsenic, antimony, and barium; i.e. the glass comprises less than 1 mol % and, in other embodiments, less than 0.1 mol %, and in still other embodiments 0 mol % of $As_2O_3$, $Sb_2O_3$, and/or BaO.

In other embodiments of the textured glass article 100a, the glass substrate 10 has a bulk composition that comprises, consists essentially of or consists of a glass composition Corning® Eagle XG® glass, Corning® Gorilla® glass, Corning® Gorilla® Glass 2, Corning® Gorilla® Glass 3, Corning® Gorilla® Glass 4 or Corning® Gorilla® Glass 5.

As also depicted in FIG. 1A, the textured region 30a of the textured glass article 100a can be defined by a porous leached layer 40a that ranges between the primary surface 12a and the textured region interface 34a of the glass substrate 10. In some embodiments, the porous leached layer 40a comprises a higher amount of silica than the silica content in the bulk composition of the glass substrate 10. As an example for purposes of illustration, a textured glass article 100a with a glass substrate 10 possessing a bulk composition comprising about 50 mol % silica may include a textured region 30a with a porous leached layer 40a possessing about 70 mol % silica. As will be outlined in greater detail below, the porous leached layer 40a can be created through a low pH treatment of the glass substrate 10.

Such a treatment can preferentially remove non-silica components of the substrate 10, thus leaving a porous leached layer 40a with a higher silica content than the bulk composition of the substrate 10.

Figure 1B:
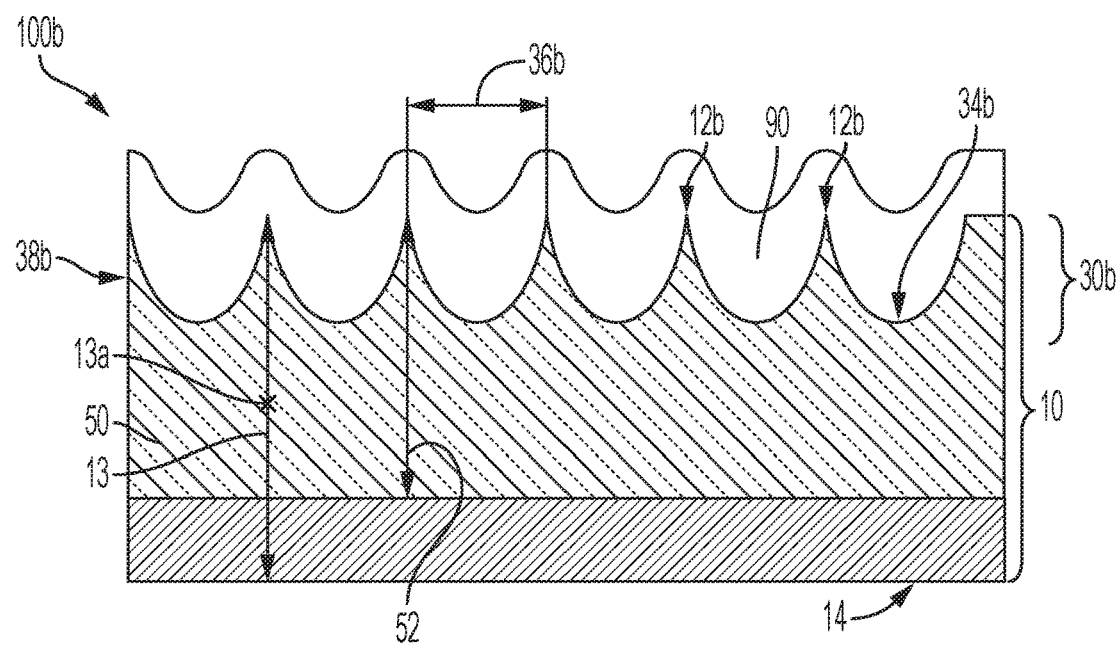

Referring now to FIG. 1B, a textured glass article 100b is depicted as including a glass substrate 10 with a plurality of primary surfaces 12b and 14, a thickness 13 and a bulk composition at the midpoint 13a of the thickness 13. In some embodiments, the bulk composition comprises about 40 mol % to 80 mol % silica. It should be understood that the textured glass article 100b is substantially similar to the textured glass article 100a with regard to function and attributes. Further, unless otherwise noted, like-numbered elements associated with textured glass article 100b depicted in FIG. 1B have the same or equivalent structure and function as the same elements associated with the textured glass article 100a depicted in FIG. 1A and outlined earlier. The primary difference between textured glass articles 100a and 100b is that the textured region 30a of the textured glass article 100a can include a porous leached layer 40a, as shown in FIG. 1A, and the textured region 30b of the textured glass article 100b is not characterized with a porous leached layer comparable to the layer 40a.

Turning back to FIG. 1B, the textured glass article 100b includes a textured region 30b with a composition having at least 40 mol % silica. The textured region 30b is defined by the primary surface 12b and the textured region interface 34b of the glass substrate 10. As depicted in exemplary fashion in FIG. 1B, the textured region interface 34b of the textured region 30b is substantially coincident with the primary surface 12b of the glass substrate 10, as indicative of a textured region 30b having little to no depth within the substrate 10. In other aspects, the primary surface 12b of the substrate 10 resides above the textured region interface 34b, as indicative of a textured region 30b having a depth within the substrate 10, e.g., as defined from the primary surface 12b to a depth given by the textured region interface 34b (not shown).

As generally depicted in FIG. 1B, the textured region 30b includes a plurality of exposed features on its primary surface 12b with an average feature size 36b and an average roughness 38b. According to some implementations of the textured glass article 100b, the exposed features of the textured region 30b, including their average feature size 36b and average roughness 38b, are configured to reduce the level of glare associated with the article when it is employed in a display device. The average feature size 36b is given by an average of the maximum dimension of a sampling of features associated with the textured region 30b, measured according to analytical techniques as understood by those with ordinary skill in the field of this disclosure, for example, by taking a photomicrograph of primary surface 12a at 200× magnification and measuring the maximum dimension of a sampling of at least ten (10) features. In embodiments, the average feature size 36b associated with the textured region 30b of the article 100b is less than about 10 microns. According to some implementations, the average feature size 36b associated with the textured region 30b is less than about 5 microns, less than about 1 micron, or less than about 0.5 microns in some cases. Further, the average feature size 36b can be less than about 10 microns, 9 microns, 8 microns, 7 microns, 6 microns, 5 microns, 4 microns, 3 microns, 2 microns, 1 micron, 0.9 microns, 0.8 microns, 0.7 microns, 0.6 microns, 0.5 microns, 0.4 microns, 0.3 microns, 0.2 microns, 0.1 microns, and all values between these upper limits.

Referring again to the textured region 30b associated with the textured glass article 100b depicted in FIG. 1B, the average roughness 38b can be measured as surface roughness, $R_a$, using the technique described above with reference to FIG. 1A. In embodiments, the glass article 100b can employ a textured region 30b having an average roughness 38b from about 10 nanometers to about 500 nanometers ($R_a$). According to some implementations, the average roughness 38b associated with the textured region 30b is from about 10 nanometers to about 500 nanometers ($R_a$), from about 20 nanometers to about 400 nanometers ($R_a$), from about 30 nanometers to about 300 nanometers ($R_a$), and all values between these levels of surface roughness. Further, in some implementations of the textured glass article 100b, the textured region 30b possesses an average roughness 38b from about 0.1 nanometers to about 300 nanometers ($R_a$), and all values between these levels of surface roughness.

According to some embodiments of the textured glass article 100b depicted in FIG. 1B, the textured region 30b can be characterized such that its composition is substantially equivalent to the bulk composition of the glass substrate 10, particularly with regard to silica content. As will be outlined in greater detail below, the textured region 30b can be created through successive low pH and high pH treatments to the glass substrate 10. The low pH treatment can preferentially remove non-silica components of the substrate 10, leaving a porous leached layer 40a with a higher silica content than the bulk composition of the substrate 10. The subsequent high pH treatment, however, can be configured to remove the porous leached layer, leaving a textured region 30b having about the same composition as the bulk composition of the glass substrate 10, particularly with regard to silica content.

As used herein, the terms "transmission haze" and "haze" refer to the percentage of transmitted light scattered outside an angular cone of about ±2.5° in accordance with ASTM procedure D1003, entitled "Standard Test Method for Haze and Luminous Transmittance of Transparent Plastics," the contents of which is incorporated by reference herein in its entirety. For an optically smooth surface, transmission haze is generally close to zero. According to implementations of the textured glass articles 100a, 100b (see FIGS. 1A & 1B), the articles can be characterized by a haze of 25% or less. In other implementations, for particular applications, textured glass articles 100a, 100b consistent with the principles of this disclosure can be fabricated with haze levels as high as 100%, haze levels ranging from 0% to 100%, haze levels from 0% to 50%, and all haze levels between these values. For example, desired haze levels in the textured glass articles 100a, 100b can be obtained by controlling the etching conditions associated with producing the respective textured regions 30a, 30b. In general, higher acid concentrations and/or etching times can increase the amount of haze associated with a particular textured glass article 100a, 100b.

According to other embodiments, the glass substrate 10 of the textured glass articles 100a, 100b (see FIGS. 1A & 1B) can possess an ion-exchangeable glass composition that is strengthened by either chemical or thermal means that are known in the art. In one embodiment, the glass substrate is chemically strengthened by ion exchange. In this process, metal ions at or near a primary surface 12a, 12b of the glass substrate 10 (see FIGS. 1A & 1B) are exchanged for larger metal ions having the same valence as the metal ions in the glass substrate. The exchange is generally carried out by contacting the glass substrate 10 with an ion exchange medium such as, for example, a molten salt bath that contains the larger metal ion. The metal ions are typically monovalent metal ions such as, for example, alkali metal ions. In one non-limiting example, chemical strengthening of a glass substrate 10 that contains sodium ions by ion exchange is accomplished by immersing the glass substrate 10 in an ion exchange bath comprising a molten potassium salt such as potassium nitrate ($KNO_3$) or the like. In one particular embodiment, the ions in the surface layer of the glass substrate 10 and the larger ions are monovalent alkali metal cations, such as $Li^+$ (when present in the glass), $Na^+$, $K^+$, $Rb^+$, and $Cs^+$. Alternatively, monovalent cations in the surface layer of the glass substrate 10 may be replaced with monovalent cations other than alkali metal cations, such as $Ag^+$ or the like.

In these embodiments, the replacement of small metal ions by larger metal ions in the ion exchange process creates a compressive stress region 50 in the glass substrate 10 that extends from the primary surface 12a, 12b to a depth 52 (see FIGS. 1A & 1B) (referred to as the "depth of layer") that is under compressive stress. This compressive stress at the primary surface of the glass substrate is balanced by a tensile stress (also referred to as "central tension") within the interior of the glass substrate. In some embodiments, the primary surface 12a or 12b of the glass substrate 10 described herein, when strengthened by ion exchange, has a compressive stress of at least 350 MPa, and the region under compressive stress extends to a depth 52, i.e., depth of layer, of at least 15 μm below the primary surface 12a or 12b.

Ion exchange processes are typically carried out by immersing the glass substrate 10 in a molten salt bath containing the larger ions to be exchanged with the smaller ions in the glass. It will be appreciated by those skilled in the art that parameters for the ion exchange process, including, but not limited to, bath composition and temperature, immersion time, the number of immersions of the glass in a salt bath (or baths), use of multiple salt baths, additional steps such as annealing, washing, and the like, are generally determined by the composition of the glass and the desired depth of layer and compressive stress of the glass as a result of the strengthening operation. By way of example, ion exchange of alkali metal-containing glasses may be achieved by immersion in at least one molten bath containing a salt such as, but not limited to, nitrates, sulfates, and chlorides of the larger alkali metal ion. The temperature of the molten salt bath typically is in a range from about 380° C. up to about 450° C., while immersion times range from about 15 minutes up to about 16 hours. However, temperatures and immersion times different from those described above may also be used. Such ion exchange treatments, when employed with a glass substrate 10 having an alkali aluminosilicate glass composition, result in a compressive stress region 50 having a depth 52 (depth of layer) ranging from about 10 μm up to at least 50 μm with a compressive stress ranging from about 200 MPa up to about 800 MPa, and a central tension of less than about 100 MPa.

As the etching and leaching processes that can be employed to create the textured regions 30a, 30b, according to some embodiments, can, in some instances, remove alkali metal ions from the glass substrate 10 that would otherwise be replaced by a larger alkali metal ion during an ion exchange process, a preference exists for developing a compressive stress region 50 in the textured glass article 100a, 100b after the formation and development of the textured region 30a, 30b. In other embodiments, a compressive stress region 50 can be developed in the glass substrate 10 prior to development of the textured region 30a, 30b to a depth 52 sufficient to account for some loss in the depth of layer in the region 50 associated with the low pH, or low and high pH treatments, as outlined below.

According to another implementation of the textured glass articles 100a, 100b depicted in FIGS. 1A and 1B, the article further includes an easy-to-clean (ETC) coating 90 disposed over the textured region 30a, 30b. In most embodiments, the ETC coating 90 is deposited over the textured region 30a, 30b such that its surface morphology generally mirrors the underlying morphology of the textured region 30a, 30b. In one embodiment, the textured glass article 100a, 100b further includes a smudge-resistant fluorine-based ETC coating 90, deposited on at least a portion of the textured region 30a, 30b. In embodiments, the ETC coating 90 comprises at least one amphiphobic substance having fluorine termination groups provide the textured region 30a, 30b with amphiphobicity (i.e., hydrophobicity and oleophobicity, or lack of affinity for both oils and water), thus minimizing wetting of the surface by water and/or oils. The fluorine termination groups of the ETC coating 90 are less polar than a surface having —OH termination groups, and therefore minimize hydrogen (i.e., Van der Waals) bonding between particles and liquids. For fingerprint oils and debris associated with fingerprints, bonding—and adhesion—is minimized. Consequently, mass transport of oils and debris from the finger to the ETC coating 90 is minimized. In one embodiment, the ETC coating 90 is formed by exchanging the hydrogen found in terminal OH groups on the textured region 30a, 30b of the textured glass article 100a, 100b with a fluorine-based moiety such as, for example, a fluorine-containing monomer (e.g., a fluorosilane), to form a glass having terminal fluorinated groups.

In another embodiment, the ETC coating 90 of the textured glass articles 100a, 100b comprises a self-assembled monolayer of a fluorine-terminating molecular chain. In yet another embodiment, the ETC coating 90 comprises a thin, fluoro-polymeric coating and, in yet another embodiment, the ETC coating comprises silica soot particles that have been treated to have pendent fluorocarbon groups attached to the soot particles. Such ETC coatings 90 can be applied to the textured region 30a, 30b of the textured glass article 100a, 100b by dipping, vapor coating, spraying, application with a roller, or other suitable method known in the art. After the ETC coating 90 has been applied, it may be "cured" at temperatures ranging from about 25° C. up to about 150° C. and, in another embodiment, at temperatures ranging from about 40° C. up to about 100° C. Curing times can range from about 1 up to about 4 hours and may be carried out in an atmosphere containing 40-95% moisture. After curing, the textured glass articles 100a, 100b with an ETC coating 90 can be solvent rinsed to remove any unbound coating and air-dried prior to use.

Generally, a glass substrate with a composition having about 40 mol % to about 80 mol % silica is subjected to a low pH leaching process and non-silica components are removed. The net result is a textured glass article (e.g., as comparable to a textured glass article 100a depicted in FIG. 1A) with a textured region having a higher silica content than the bulk composition of the substrate. Substrates having a silica content less than 40 mol % essentially fall apart or significantly degrade from removal of non-silica components during the low pH treatment. Substrates having a silica content greater than 80 mol % are nearly indistinguishable from the surface of the substrate prior to etching and consequently, do not possess a textured region consistent with the principles of the disclosure after being subjected to the low pH treatment.

Figure 2A:
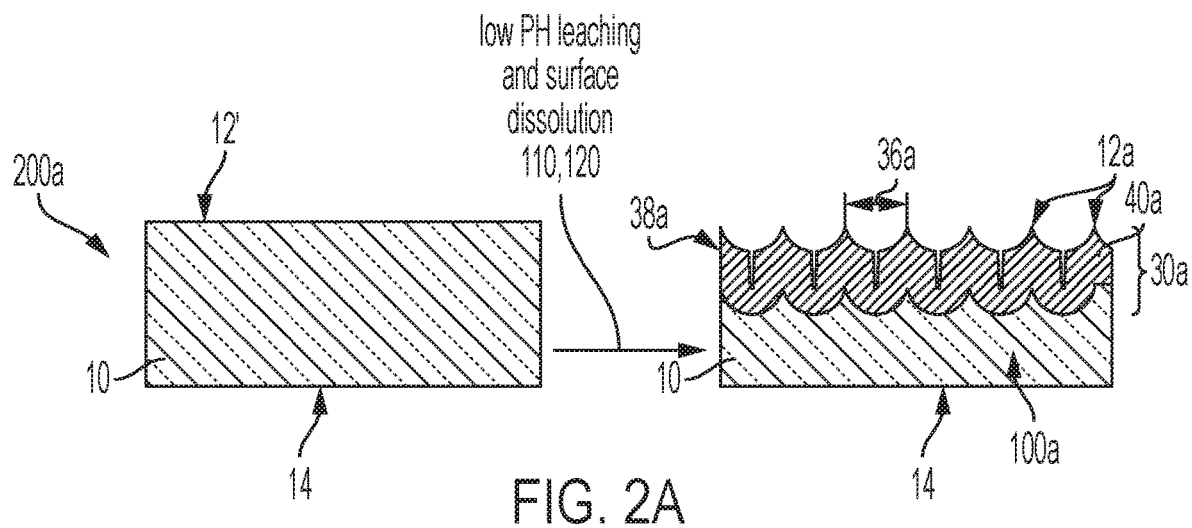
FIG. 2A illustrates a schematic, flow chart of a method of making a textured glass article as in FIG. 1A, according to some embodiments.

Referring now to FIG. 2A, a schematic, flow chart is provided that depicts a method 200a of making a textured glass article, e.g., a textured glass article 100a (as depicted in FIG. 1A). As shown, a glass substrate 10 is provided with an initial primary surface 12', along with an opposing primary surface 14. An etching step 110, 120 is then conducted to the substrate 10 that includes etching the initial primary surface 12' with a hydrofluoric acid-free etchant having a pH of about 3 or less. With further regard to the etching step 110, 120, it includes a metal ion leaching portion 110 (e.g., alkali metals from the substrate 10) and a surface dissolution portion (e.g., silica from the substrate 10). In some embodiments of the method 200a, hydrochloric acid and/or citric acid can be employed as the hydrofluoric acid-free etchant during step 110, 120. According to an embodiment, etching step 110, 120 is conducted at an elevated temperature from above ambient temperature to about 100° C. In some implementations, the etching step 110, 120 is conducted at about 25° C., 30° C., 35° C., 40° C., 45° C., 50° C., 55° C., 60° C., 65° C., 70° C., 75° C., 80° C., 85° C., 90° C., 95° C., 100° C., 105° C., 110° C., and all temperatures between these values. Further, the etching step 110, 120 can be conducted from about 15 minutes to about 100 hours. In some embodiments, the etching step 110, 120 is conducted from about 5 hours to about 30 hours. Suitable concentration levels for hydrochloric acid etchants, according to some implementations, range from about 0.5% to about 15% by weight, e.g., about 0.5%, 1%, 2%, 3%, 4%, 5%, 6%, 7%, 8%, 9%, 10%, 11%, 12%, 13%, 14%, 15%, and all concentrations of hydrochloric acid between these levels. Suitable concentration levels for citric acid etchants, according to other implementations, range from about 1% to 30% by weight, e.g., about 1%, 2%, 3%, 4%, 5%, 6%, 7%, 8%, 9%, 10%, 11%, 12%, 13%, 14%, 15%, 16%, 17%, 18%, 19%, 20%, 21%, 22%, 23%, 24%, 25%, 26%, 27%, 28%, 29%, 30%, and all concentrations of citric acid between these levels. Upon completion of the etching step 110, 120, a textured region 30a is formed in the textured glass article 100a (see also FIG. 1A).

According to another embodiment of the method 200a of making a textured article shown in FIG. 2A (e.g., a textured glass article 100a (as depicted in FIG. 1A)), the etching step 110, 120 can include etching the initial primary surface 12' of the glass substrate 10 having a thickness 13 (as shown in FIG. 1A) with a hydrofluoric acid-free etchant having a pH of about 3 or less and an additive salt. In some embodiments, the hydrofluoric acid-free etchant can a pH of about 2.9 or less, 2.8 or less, 2.7 or less, 2.6 or less, 2.5 or less, 2.4 or less, etc. . . . . As used herein, the term "additive salt" comprises a salt comprising one or more of a multivalent metal cation (e.g., $Al^{3+}$), an ammonium cation (e.g., $NH_4^+$) and a metal cation not present or at a trace abundance in the glass substrate 10 (e.g., $Li^+$ for certain compositions of glass substrate 10). In some embodiments, the additive salt can comprise a multivalent metal ion and/or an ammonium ion, e.g., as selected from the group consisting of $NH_4^+$, $Al^3$, $Fe^3$, $Ca^{2+}$ and $Mg^{2+}$. For example, the additive salt can be $NH_4Cl$, $AlCl_3$, $FeCl_3$, $CaCl_2$ and $MgCl_2$. In some embodiments, the additive salt can also include salts comprising a cation not present or in a trace abundance within the target glass substrate 10, e.g., $NH_4Cl$, $LiCl$, $CsCl$, etc. According to some embodiments, the etching step 110, 120 is conducted such that the additive salt (in addition to the hydrochloric acid-free etchant) is employed at a concentration from greater than about 0.1M to about 5M. According to some embodiments, the multivalent metal salt is employed in the etching step 110, 120 at a concentration from greater than about 0.1M to about 3M, from about 0.5M to about 2M, from about 0.5M to about 1.5M, and all concentration values between these range endpoints. In some implementations of the etching step 110, 120 employing an additive salt, the etching is conducted at a temperature from about 75° C. to about 110° C., from about 80° C. to about 110° C., from about 85° C. to about 110° C., from about 90° C. to about 110° C., and all temperatures between these range endpoints. Advantageously, the incorporation of the additive salt into the etching step 110, 120 can reduce the etching time needed to develop the desired level of haze and the textured region 30a (see also FIG. 1A). According to some implementations of the etching step 110, 120 employing an additive salt, the etching can be conducted from about 15 minutes to about 10 hours. In preferred implementations, the etching step 110, 120 can be conducted with an additive salt from about 15 minutes to about 5 hours, from about 30 minutes to about 5 hours, or even from about 30 minutes to 2 hours.

Referring again to FIG. 2A, in some embodiments, the method 200a further includes a removing step configured to remove excess etchant and leached substrate constituents from the etching step 110, 120. That is, after step 110, 120 of the method 200a, excess etchant, along with any constituents from the initial primary surface 12' of the substrate 10, are then removed by rinsing the etchant on the initial primary surface 12' with deionized water. As would be understood by those with ordinary skill in the field of the disclosure, various mechanical and/or aqueous cleaning approaches can be employed in the removing step to remove excess etchant and leached substrate constituents without materially affecting the surface of the substrate 10.

Figure 2B:
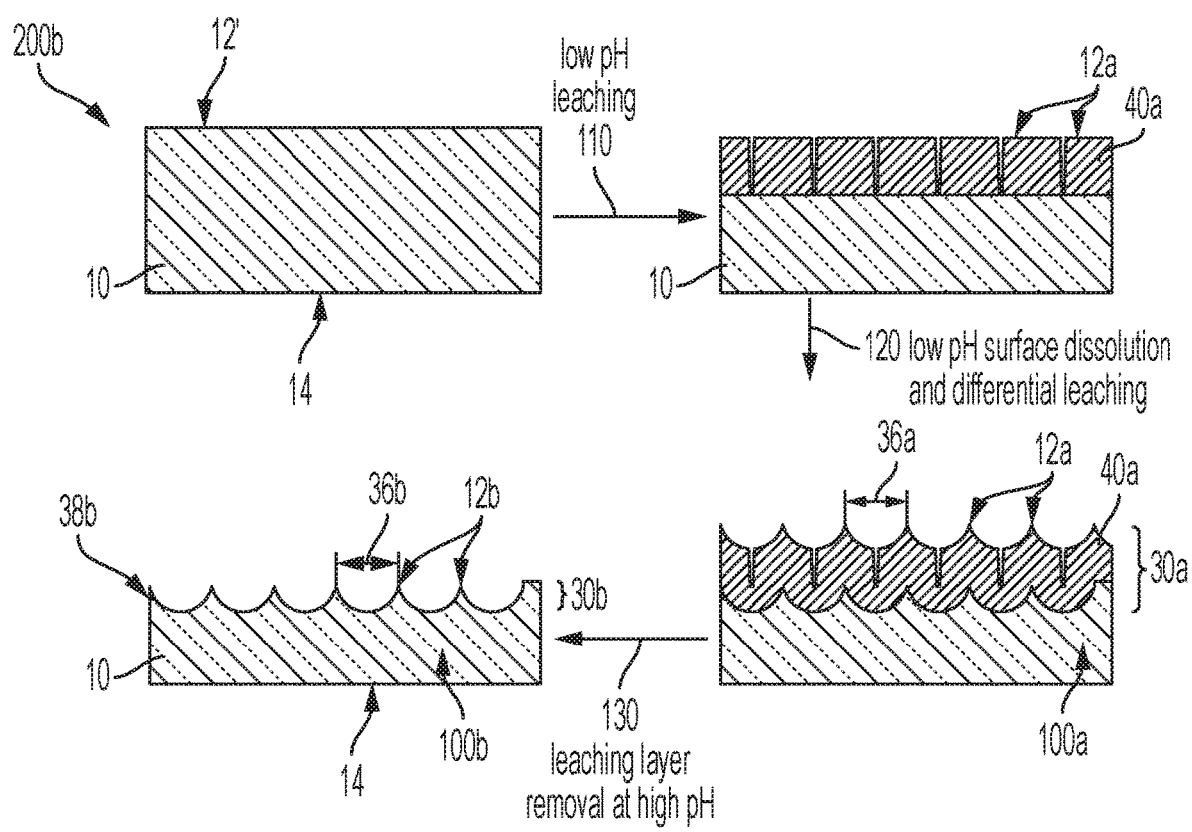
FIG. 2B illustrates a schematic, flow chart of a method of making a textured glass article as in FIG. 1B, according to some embodiments.
Figure 3:
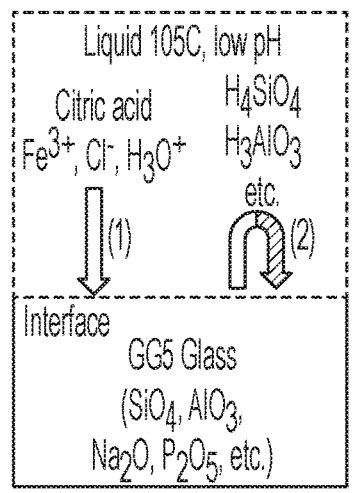
FIG. 3 illustrates a leaching process occurring at a glass-solution interface where ions and solutes diffuse, exchange, dissolute and redeposit, according to some embodiments.

In embodiments, the etching step of the method 200a shown in FIG. 2A is associated with a low pH leaching portion 110, and a low pH surface dissolution and differential leaching portion 120 (see also FIG. 2B) whereby leaching occurs at a glass-solution interface where ions and solutes diffuse, exchange, dissolute and redeposit onto the glass surface (e.g., see FIG. 3, which exemplifies leaching as conducted with glass comprising $SiO_2$, $Al_2O_3$, $Na_2O$, $P_2O_5$, etc.).

Without being bound by theory, the low pH leaching portion 110 occurs during an initial period during the etching and results in leaching of non-silica constituents from the substrate 10. According to some embodiments, the low pH leaching portion 110 can be represented by the following reaction ("Reaction 1"): $M^{x+}$ (in glass substrate)→$M^{x+}$ (etchant), where M represents metal ions leaching from the glass substrate 10 into the etchant, and x equals an integer. As crevices and other high depth features are created in the initial primary surface 12' of the glass substrate 10 during the low pH leaching portion 110, preferential removal of additional non-silica constituents occurs to the glass substrate in these crevice regions (e.g., at a higher leaching rate than surrounding material) during the differential leaching portion 120, leading to the additional development of features below the leached layer 40a. According to some embodiments, the differential leaching portion 120 can be represented by the following reaction ("Reaction 2"), which describes silica layer dissolution at the surface of the glass substrate 10: $(SiO_2)n$ (in glass substrate)+2n $H_2O$→n $H_4SiO_4$ (i.e., silicic acid formed within the etchant), where n is an integer. It is also believed that the foregoing reaction can proceed in reverse, with silicic acid precipitating out as $SiO_2$ within the etchant ("Reaction 3"). As the concentration of silicic acid is reduced in Reaction 3, Reactions 1 and 2 are not rate-limited and can continue, facilitating the etching process to obtain the textured region 30a. As such, the textured region 30a formed during the etching step 110, 120 can have multiple morphologies, e.g., at the primary surface 12a and at the interface 34a between the leached layer 40a and the underlying substrate 10 (see FIG. 1A).

Without being bound by theory, the rate of formation of the textured region 30a according to the method 200a can be accelerated or decelerated by controlling aspects of the foregoing Reactions 1, 2 and/or 3. For example, a reduction in the amount of water employed in the etchant can slow Reaction 2 (e.g., by adding a water-soluble organic solvent) and, accordingly, the rate at which method 200a proceeds. Similarly, adding silicic acid to the etchant can also slow Reaction 2 which, in turn, will slow the rate at which method 200a proceeds. According to some embodiments of the method 200a, as noted above, the etching step 110, 120 can also employ an additive salt. In particular, the additive salt can serve as a catalyst in Reaction 3. That is, the additive salt (inclusive of $NH_4Cl$) will accelerate Reaction 3 such that the silicic acid precipitates, re-nucleates and/or polymerizes in the etchant, thus reducing the concentration of silicic acid in the etchant. As a consequence, the reduction in silicic acid in the etchant should allow for the acceleration of Reaction 1, thus accelerating the overall rate of formation of the textured region 30a according to the method 200a. According to another implementation, each of the Reactions 1, 2 and 3 can be accelerated by increasing the reaction temperature, up to about 100° C. Finally, it is also possible to slow Reaction 1 by incorporating metal ions of the glass substrate 10 into the etchant (e.g., $Li^+$, $Na^+$, and $K^+$).

As shown in FIG. 2B, a schematic, flow chart is provided that depicts a method 200b of making a textured glass article, e.g., a textured glass article 100b (as depicted in FIG. 1B). The etching step 110, 120 of the method 200b is the same as employed in the method 200a depicted in FIG. 2A. Further, embodiments of the method 200b can include a removing step conducted after the etching step 110, 120 to remove excess etchant and leached substrate constituents from the etching step 110, 120. More particularly, the completion of the etching step 110, 120 in the method 200b results in an interim textured glass article having a textured region 30a and a leached layer 40a (e.g., as comparable to the textured glass article 100a shown in FIGS. 1A and 2A). At this point, the method 200b continues with a treating step 130 conducted by treating the textured region 30a with an etchant having a pH of about 10.0 or greater to form a textured region 30b. In embodiments, the etchant employed during the step 130 is an aqueous, alkaline solution having a pH that ranges from about 10 to about 13. In particular, the leached layer 40a is removed during the treating step 130, leaving the textured region 30a, which is defined by the primary surface 12b of the substrate 10. In embodiments of the method 200b, the primary surface 12b is initially formed during the differential leaching portion 120 of the etching step 110, 120 and later 'revealed' by the removal of the leached layer 40a during the treating step 130. In some embodiments of the method 200b, the composition of the textured region 30b is substantially equivalent to the bulk composition of the glass substrate 10, particularly with regard to silica.

EXAMPLES

The following examples describe various features and advantages provided by the disclosure and are in no way intended to limit the invention and appended claims.

With controllable lateral feature size (e.g., 10 μm or less, 5 μm or less, etc.) and corresponding surface roughness, non-HF processes are highly beneficial to sparkle reduction (i.e. low PPD), and are able to create desirable surface texture, especially for high density display applications. Moreover, unique small features of high frequency may also be jointed with other low-frequency surface texture for advanced optical property designs.

One challenge in using non-HF processes for large-scale manufacturing production is short bath lifetime of the leaching solution, whereby chemical activity degrades 40-50% after each use. This degradation is mainly due to leached-out and dissolved Si—O-modifier (Al, Na, Mg, etc.) polymerizing and redepositing on the glass surface, and partially due to the Fe ion (catalyst) consumption. As a result, manufacturing costs are adversely affected due to increases in energy consumption, utility maintenance, tool time loss, and leaching solution replacement.

As demonstrated herein, acidity control (e.g., HCl cycling) in the used solution may enable bath lifetime extension up to the 6th cycle (as compared with current maximum cycling of up to 2 cycles), thereby lowering process cost from $6.99/qft (1 cycle) to $3.10/qft according to cost models. Additionally, $Fe^{3+}$ spiking may also extend bath lifetime to 4-5 cycles.

Example 1

Figure 4A:
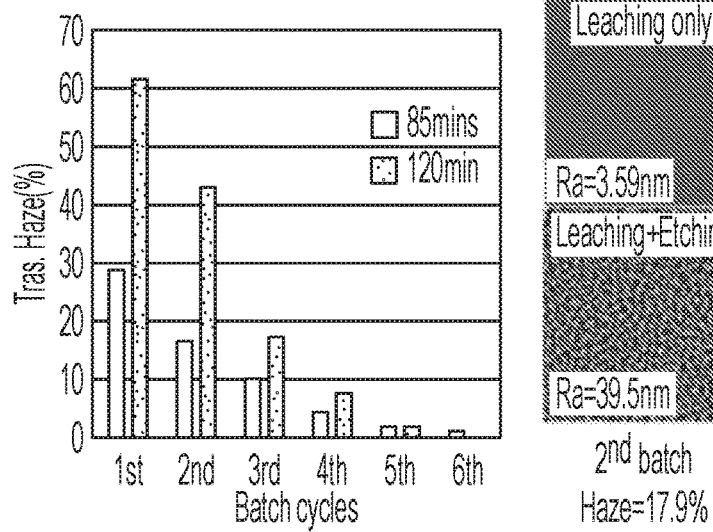
FIG. 4A illustrate a plot of measured decay of transmittance haze from treated glass as a function of batch cycles using leaching times of 85 and 120 mins, followed by base-solution etching.
Figure 4B:
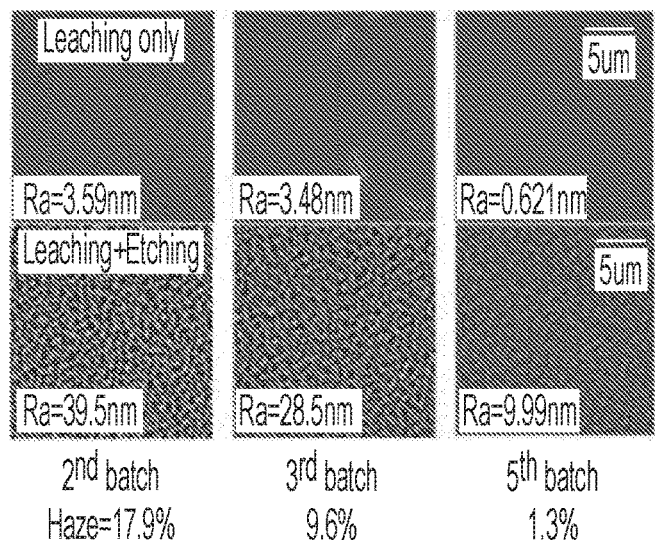
FIG. 4B illustrates corresponding atomic force microscopy (AFM) images of as-leached (upper images) and after etching (bottom images) surfaces, exhibiting decreased surface roughness of glasses as batch cycles are increased, according to some embodiments.

To illustrate the importance of $Fe_3^+$ concentration and acidity in the leaching process, for example, FIG. 4A shows a plot of measured decay of transmittance haze from treated glass as a function of batch cycles using leaching times of 85 and 120 mins (followed by base solution etching), while FIG. 4B shows corresponding atomic force microscopy (AFM) images of as-leached (upper images) and after etching (bottom images) surfaces. In both instances—when each batch cycle is either 85 min or 120 min—transmittance haze steadily decreases with the number of batch cycles. For each batch cycle, glass sample were immersed into leaching solution at a stable temperature of 105° C. After a predetermined amount of time, the samples were removed from the leaching solution and the next batch was immediately immersed in the same leaching solution as the previous batch. After removing from the leaching solution, the glass samples were washed with deionized (DI) water using ultrasonication, prior to post-etching.

Decay in the leaching performance of the Fe-containing acid solution with each subsequent cycle may be due to a gradual loss of surface texture (as a result of the leaching and/or alkaline etching step) of the glass at the solution-glass interface. This is exemplified in FIG. 4B, which exhibits decreasing glass surface roughness as batch cycles are increased. When only leaching is conducted (i.e., steps 110 and 120 of FIG. 2B), AFM images indicates surface roughness decreasing from 3.59 nm to 3.48 nm to 0.621 nm after the 2nd, 3rd, and 5th batches, respectively. After an additional etching step (i.e., step 130 of FIG. 2B), surface roughness decreasing from 39.5 nm to 28.5 nm to 9.99 nm after the 2nd, 3rd, and 5th batches, respectively.

Example 2

Figure 5A:
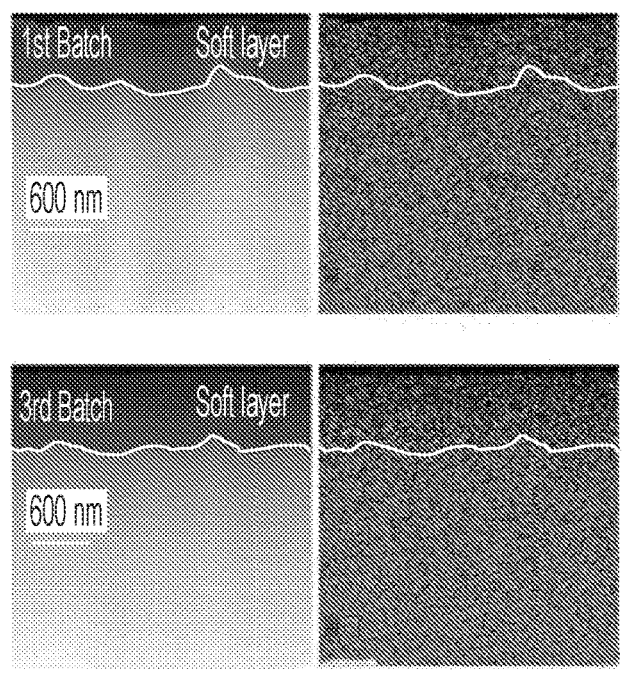
FIG. 5A illustrates cross-sectional transmission electron microscopy (TEM) images (left) and energy-dispersive x-ray spectroscopy (EDX) images for elemental silicon and aluminum (right) mapping of as-leached glass for 85 mins in the 1st (top) and 3rd (bottom) batches.

Further analysis of the as-leached glass (i.e., after steps 110 and 120 of FIG. 2B) is conducted by cross-sectional transmission electron microscopy (TEM) and energy-dispersive x-ray spectroscopy (EDX) as in FIG. 5A indicates not only the presence of a soft layer (i.e., porous leached layer 40a of FIGS. 2A and 2B) atop the glass surface after a 1st batch (top-left) and 3rd batch (bottom-left), but also elemental composition, with the soft layer and bulk glass comprising silicon and aluminum in both the 1st batch (top-right) and 3rd batch (bottom-right). Each batch cycle is 85 min. Moreover, the cross-section analysis by TEM and EDX shows thick leaching layers (less Al) appearing distinct ripple feature but featureless in the 1st and 3rd batches, respectively. In other words, although these two batches have a similar soft layer in terms of chemical composition and thickness, the 1st batch exhibits more pronounced embedded ripple features characteristic of the glass surface than does the 3rd batch (compare soft layer-glass interface of 1st batch and 3rd batch).

Figure 5B:
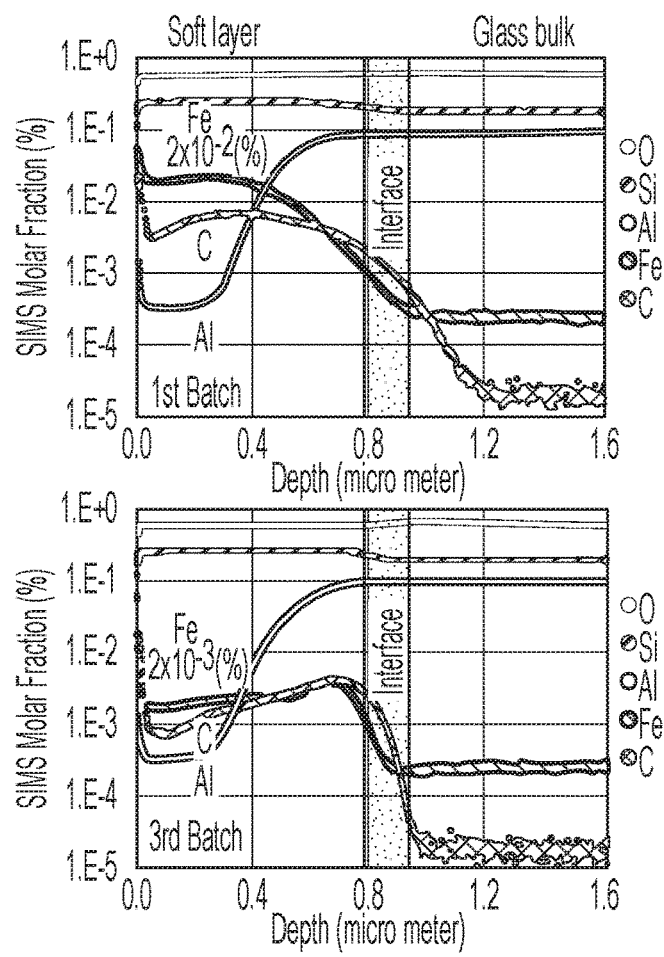
FIG. 5B illustrates corresponding secondary ion mass spectroscopy (SIMS) profiles for elemental O, Si, Al, Fe and C across from surfaces, soft layers to glass bulks, according to some embodiments.

Specific compositions are detailed in the secondary ion mass spectroscopy (SIMS) profiles of FIG. 5B, which shows that a steady (i.e., virtually constant) amount of silicon and oxygen is present throughout the soft layer and bulk glass, aluminum content increases with depth into the soft layer-bulk glass structure such that a steady-state amount is reached close to the soft layer-bulk glass interface moving into the bulk glass, decrease is iron and carbon concentrations across the interface. With respect to iron, as batch cycles increase from the 1st batch (FIG. 5B, top) to the 3rd batch (FIG. 5B, bottom), SIMS is able to confirm that Fe concentration decreases from $2 \times 10^{-2}$(%) to $2 \times 10^{-3}$(%) and also an increasing negative slope corresponding to sharper decreases in Fe concentration across the soft layer-bulk glass interface, respectively. In other words, the leaching (e.g., soft) layer of the 3rd batch comprises less carbon and iron. The Fe ions—known to accelerate the leaching process—penetrate less deeply into the soft layer by one order of magnitude; without being bound by theory, this likely degrades leaching ability in later batches. The Fe-deficient leaching layer may be attributed to (1) Fe ion consumption and (2) Si—O complex formation upon surfaces limiting the Fe penetration.

Example 3

As disclosed herein, batch extension (i.e., bath lifetime) may be maximized with stable leaching ability under a consistent surface texture formation by using $Fe_3^+$ spiking and acidity control (HCl spiking) into the leaching solution.

Figure 6A:
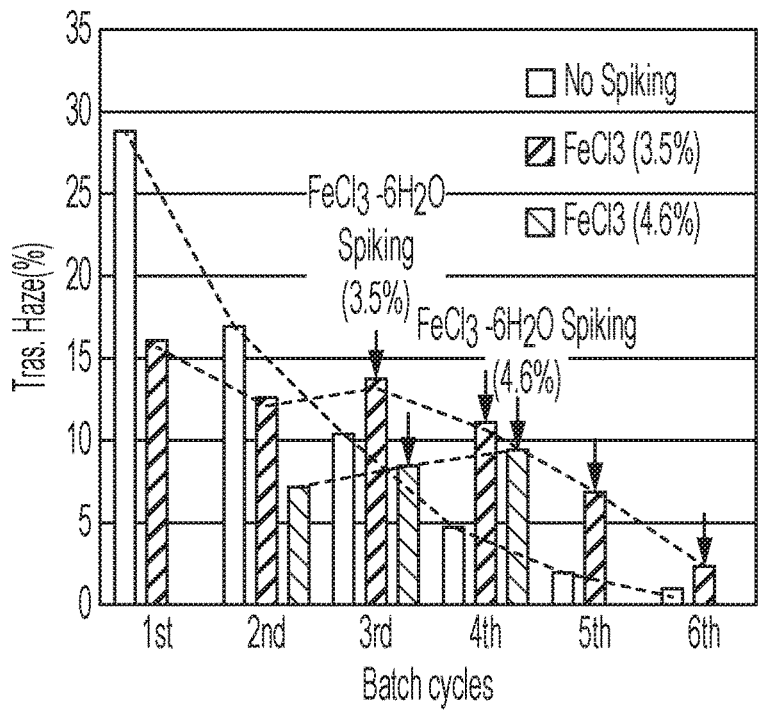
FIG. 6A illustrates higher haze values obtained in extend bath lifetime by $Fe^{3+}$ spiking (3.5 wt. % and 4.6 wt. % of $FeCl_3.6H_2O$) in leaching solutions after the 2nd batch, indicated by arrows, with respect to ones without spiking.

To enrich Fe contents in the leaching layer of later batches, $FeCl_3 \cdot 6H_2O$ spiking was conducted on batches after the 2nd batch. As explained in Examples 1 and 2, Fe ions are able to penetrate less deeply into the soft layer to degrade leaching ability in successive batches. One cause of this may be due to Fe ion consumption and $FeCl_3 \cdot 6H_2O$ spiking may help to replenish Fe ion supply. FIG. 6A illustrates comparative transmittance haze values with increasing batch cycles for: no spiking (reproduced from FIG. 4A, 85 min cycling time); 3.5 wt. % $FeCl_3 \cdot 6H_2O$ spiking; and 4.6 wt. % $FeCl_3 \cdot 6H_2O$ spiking. FIG. 6C illustrates $FeCl_3$ dissociation in water and $Fe_3^+$ hydrolysis reactions as in $FeCl_3 \cdot 6H_2O$ spiking. In the hydrolysis reactions, forward and reverse reactions represent protonation and deprotonation in water, respectively.

Unlike the case with no spiking (baseline solution), both spiking amounts of 3.5 wt. % and 4.6 wt. % are able to more effectively mitigate haze decay occurring after the 3rd batch cycle. Thus, these higher haze values show that $Fe^{3+}$ spiking is able to extend bath lifetime in leaching solutions after the 3rd batch, as compared with leaching solutions without spiking. For example, from the 4th to 6th batches with 3.5 wt. % $Fe^{3+}$ spiking, the enhanced haze results are greater than three times higher than haze values for the non-spiked leaching solutions. Furthermore, even at the higher spiking amount of 4.6 wt. % $Fe^{3+}$, gradual increases in haze are observed from the 2nd to 4th batches.

Figure 6B:
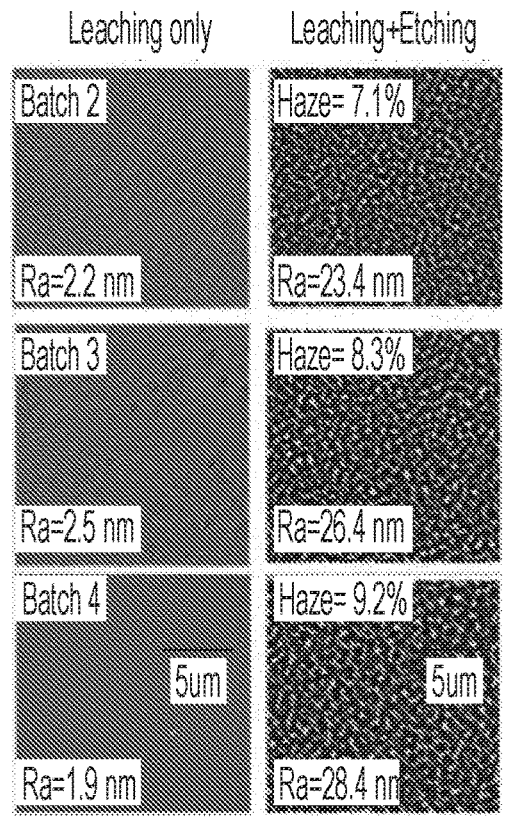
FIG. 6B illustrates corresponding AFM-imaged surfaces exhibiting gradually enhanced roughness (after etching) as similar to slightly increasing haze values ($Fe^{3+}$ spiking by 4.6 wt. %), which is in opposite to as-leached surfaces with decreasing roughness.

Referring to FIG. 6B, unlike the trend observed in FIG. 4B, where glass surface roughness of the post-etched glass (i.e., after step 130 of FIG. 2B) decreased with increasing batch cycles without leaching, here, surface roughness increases from 23.4 nm to 26.4 nm to 28.4 nm after the 2nd, 3rd, and 4th batches spiked with 4.6 wt. % $Fe^{3+}$, respectively. Thus, the AFM-imaged surfaces of FIG. 6B confirm increasing roughness of the post-etched surfaces. However, even though the post-etched glass after the 4th batch is rougher that of the 2nd and 3rd batches, the as-leached surface (i.e., after steps 110 and 120 of FIG. 2B) of the 4th batch is smoother than the as-leached surfaces of the 2nd and 3rd batches. This observed smoother surface suggests (1) that gelation may become an important factor leading to a build-up of a dense re-deposition layer on the leaching front interface; and (2) a decreased dissociation efficiency of $Fe_3^+$ in $FeCl_3 \cdot 6H_2O$ solutions having higher $Fe^{3+}$ concentrations (i.e., higher that 4.6 wt. %). In other words, this observed smoother surface suggests that the increasingly leached-out and dissolved glass elements (Si, Al, Na, and other ions) may gel and re-deposit as a dense Si—O—X layer (where, X is Al, Na, and other ions) on the leaching front interface. Additional $Fe^{3+}$ spiking beyond the 5th batch is not effective for lifetime extension, likely due to this redeposition layer and/or decreased dissociation efficiency of $Fe_3^+$ from $FeCl_3 \cdot 6H_2O$, oversaturated in late batches.

Example 4

Batch extension (i.e., bath lifetime) may also be maximized with stable leaching ability under a consistent surface texture formation by using acidity control, for example, by spiking citric acid into the leaching solution.

Citrate is regarded as a chelating agent that stabilizes dissolved ions and prevents Si—O-salt (metal) sedimentation (Si—O complex formation upon surfaces). This would thereby aide in Fe penetration.

Figure 7A:
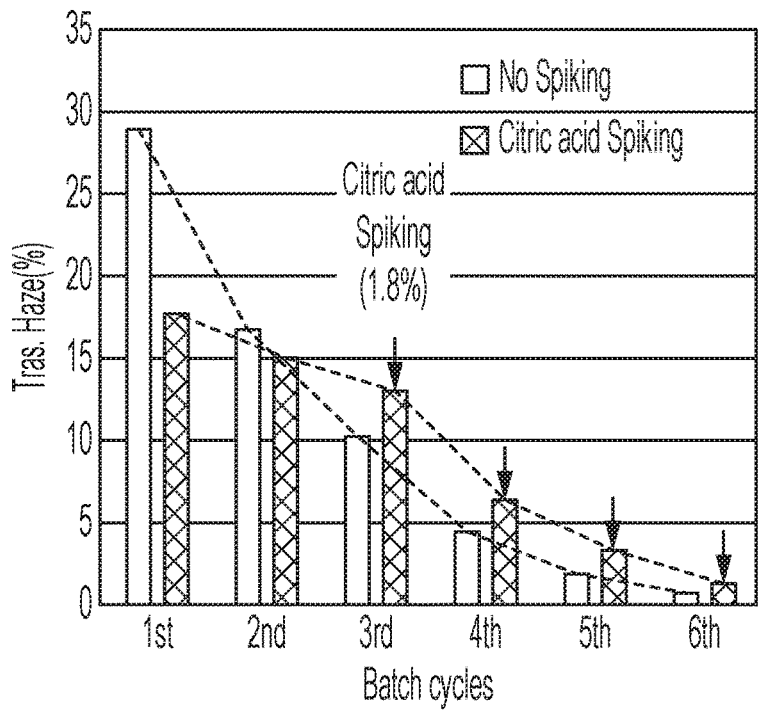
FIG. 7A illustrates comparable haze decay in extend batches by citric acid spiking (1.8 wt. %) in leaching solutions after the 2nd batch, indicated by arrows, with respect to ones without spiking.

FIG. 7A illustrates comparative transmittance haze values with increasing batch cycles for: no spiking (reproduced from FIG. 4A, 85 min cycling time) and 1.8 wt. % citric acid spiking. FIG. 7C illustrates citric acid hydrolysis reactions, where the forward and reverse reactions represent protonation and deprotonation in water, respectively.

Unlike the case with no spiking (baseline solution), the spiking amount of 1.8 wt. % citric acid is able to mitigate haze decay to some extent. Thus, higher haze values are observed after the 2nd batch for batch cycles 3-6 (indicated by arrows), thereby extending bath lifetime in leaching solutions after the 2nd batch, as compared with leaching solutions without spiking. Degradation in haze performance is observed with slightly higher haze by 2%. In other words, citric acid spiking allows for a gradual decrease in haze, while each haze is 2% higher than the reference (i.e. no spiking).

Figure 7B:
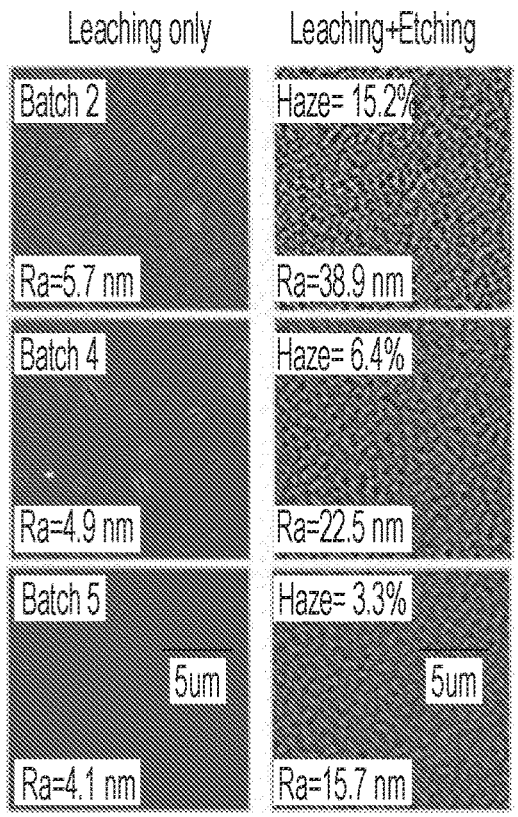
FIG. 7B illustrates corresponding AFM images exhibiting reduced roughness in both as-leached and post-etching surfaces as increasing batch cycles.
Figure 7C:
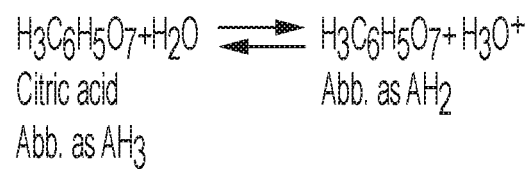
FIG. 7C illustrates citric acid hydrolysis reactions, according to some embodiments.

Referring to FIG. 7B, corresponding AFM images after the 2nd, 4th, and 5th, batch cycles exhibit reduced roughness in both the as-leached and post-etching surfaces. In other words, both of the as-leached and post-etched surfaces gradually lose surface texture with increasing batch cycles. This may be due to minimal reactivation of leaching by either incorporating more carbon contents in the leaching layer or stabilizing the dissolved ions from the leaching layer. The increase in haze may be attributed to increased hydronium ($H_3O^+$) concentration from partially dissociated citric acid in water (slightly increasing acidity). The limited hydronium formation is due to a high dissociation constant ($pKa_1=3.13$) of citric acid.

Example 5

Figure 8A:
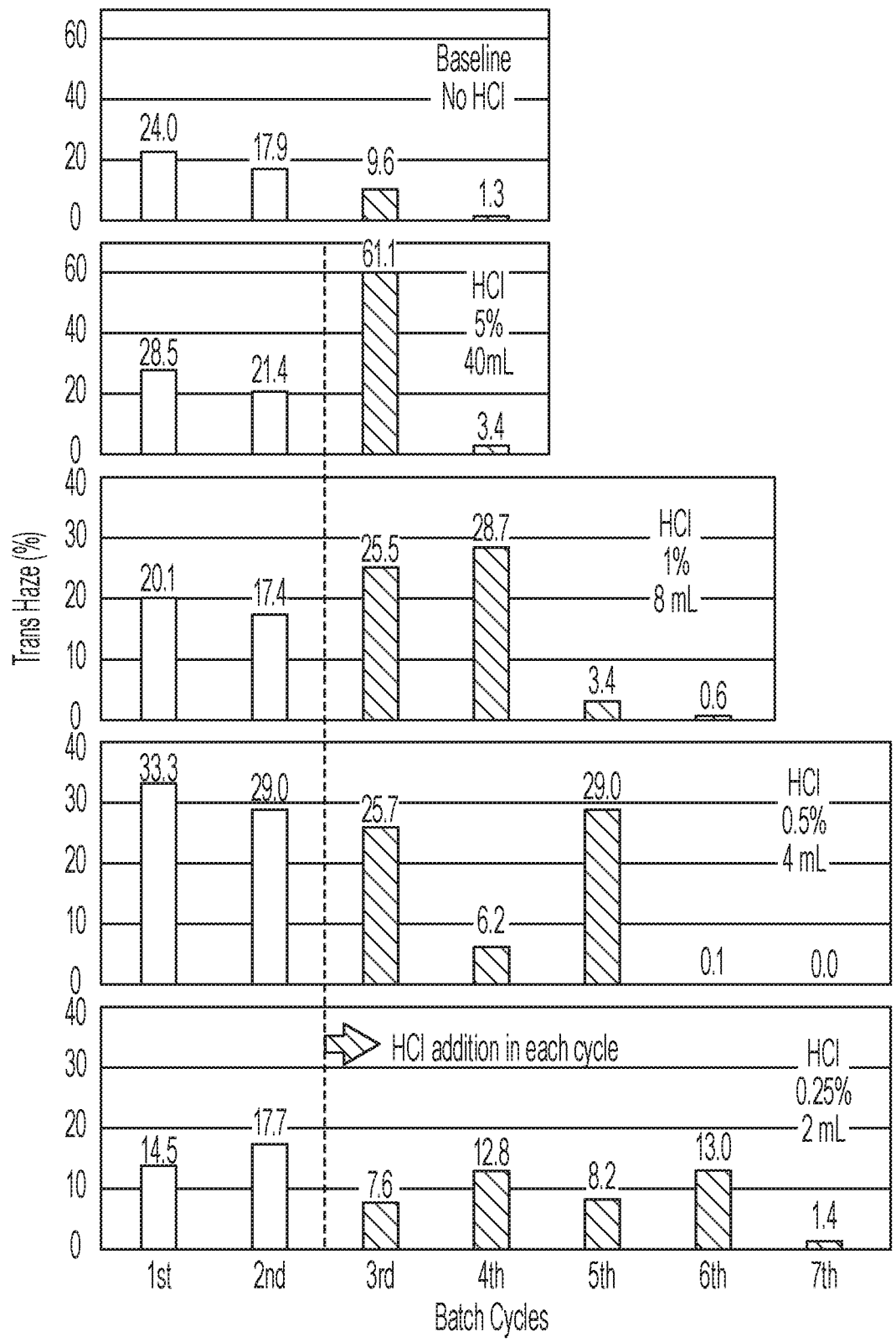
FIG. 8A illustrates extended batch lifetime by HCl spiking with different amounts, 2, 4, 8 and 40 mL after the 2nd batch.

To effectively manipulate acidity without introducing side effects from other chemicals, hydrochloric acid ($HCl_{aq}$, 37 wt. %) may be adopted as a spiking agent in late batches. Hydrochloric acid is a strong acid with a low $pK_a$ constant of −7, thereby making it thermodynamically favorable to be dissociated as $H_3O^+$ and $Cl^−$ in water. FIG. 8A illustrates extended batch lifetime by HCl spiking with different amounts (e.g., 2 mL (0.25%), 4 mL (0.5%), 8 mL (1%) and 40 mL (5%)) after the 2nd batch; significant effects on haze performance and batch lifetime extension are observed.

Large amount spiking by 5 wt. % (40 mL) has abrupt haze variation, increasing up to 61.1% in the 3rd batch, but subsequently dropping to 3.4% in the following 4th batch. Lowering HCl amounts leads to leaching stability and gradual improvement of lifetime. For example, lowering HCl spiking to 1% (8 mL) shows abrupt haze variation after the 4th batch (28.7% in the 4th batch, dropping to 3.4% in the 5th batch), rather than the 3rd batch as observed for the 5 wt. % (40 mL) spiking. The optimal spiking amount is 2 mL (0.25 wt. %). Haze performance may be maintained around 10% and can be extended up to the 6th batch, at which point haze decreases to 1.4%.

FIG. 8B illustrates AFM imaged surfaces from as-leached and post-etching treatments in early, middle and last batches. B2(L), B3(L), B4(L), B5(L), B6(L), and B7(L) represent as-leached surface in the 2nd, 3nd, 4th, 5th, 6th, and 7th batches, respectively, and B2(L+E), B3(L+E), B4(L+E), B5(L+E), B6(L+E), and B7(L+E) represent as-leached and post-etching in the 2nd, 3nd, 4th, 5th, 6th, and 7th batches, respectively. Corresponding post-etching surface (i.e., after step 130 of FIG. 2B and represented with a "(L+E)" designation) textures correlate well with haze values. Sub-micrometer lateral features may also be observed in the late batches for 2 mL and 4 mL HCl spiking and are comparable with early batches. In contrast, the as-leached surface (i.e., after steps 110 and 120 of FIG. 2B and represented with a "(L)" designation) appears less correlated with the consequent haze after the post-etching. This demonstrates feasibility of the leachability re-activation by an optimal HCl spiking. Gradually lowering pH results in better performance, since over-supplying HCl causes wider lateral features and shorter leaching lifetime.

Example 6

Figure 9A:
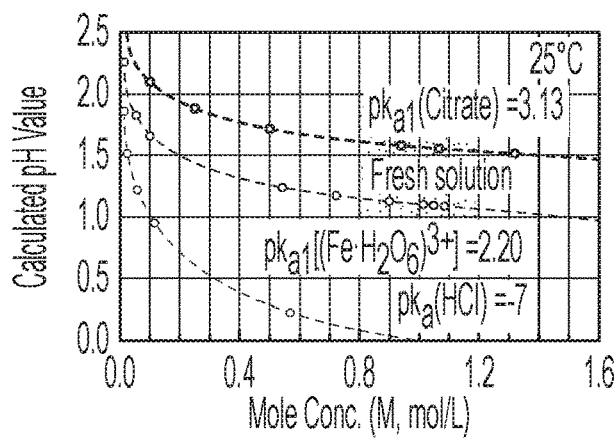
FIG. 9A illustrates calculated pH values as a function of molar concentrations of citric acid, $Fe_3^+$ and HCl, respectively, based on known pKa values (citric acid=3.13, $Fe_3^+$=2.20, HCl=−7), according to some embodiments. The lowest pKa of HCl suggests highly effective $H^+$ dissociation and acidity increase in water.

FIG. 9A illustrates calculated pH values as a function of molar concentrations of citric acid, $Fe_3^+$ and HCl, respectively, based on known pKa values (citric acid=3.13, $Fe_3^+$=2.20, HCl=−7). The lowest pKa of HCl suggests that HCl is the most effective in $H^+$ dissociation to form $H_3O^+$, as well as increasing acidity in water by lowering the calculated pH value from 1.52 to 0.25. In other words, while the table and plot of FIG. 9A illustrate the pH lowering capability of HCl spiking—i.e., that increasing HCl concentration lowers the pH at a faster rate (smaller number of batch cycles)—as noted in FIG. 8A, the optimal spiking amount is 2 mL (0.03 mol/L) since haze performance stabilizes around 10% and can be extended up to the 6th batch. Moreover, over-supplying and batch-by-batch increasing of HCl spiking introduces more surface etching instead of leaching and limits surface texture formation for further lifetime extension.

The pH value of the baseline leaching solution (1M $Fe_3^+$ and 1M citric acid) ranges from 1.0 to 1.5, tested by a litmus paper, and agrees with calculated values (see boxed area of FIG. 9A plot). By adding more HCl, the leaching solution contains more $H_3O^+$ and tends to release more active (unchelated) $Fe_3^+$ in a low pH equilibrium state, which favors the backward reactions (see hydrolysis reactions of FIGS. 6C and 7C) and reduces ferrous hydroxide (such as $Fe(OH)^{2+}$ and $Fe(OH)_2^+$) and the chelated complex in FIG. 9B. These weakened chelating effects are expected due to loss of protonation ability of citric acid in pH's less than 1. Protonation and deprotonation are described in FIGS. 6C and 7C. HCl spiking likely prompts both $H_3O^+$ and $Fe_3^+$ to participate and maintain the leaching process in the late batches. This mechanism is one reason why HCl spiking is more effective than citric acid and $FeCl_3$ additions for the bath lifetime extension. Additionally, HCl spiking also prevents redeposition by dissolving more silicic acid and improves leaching ability. The source of silicic acid may be attributed to a leaching layer in which the Si complex and other glass ions leach from the glass surface and dissolve into the leaching solution. Silicic acid increases with increasing leaching batches, gradually begins gelation, and finally, redeposits on the leaching surface. Thicker and denser redeposition layers prevent effective leaching of $Fe^{3+}$ and hydronium towards the glass surface ("inward diffusion") and leached-out composition away from the glass surface ("outward diffusion"), thereby making distinct lateral feature difficult.

Figure 9B:
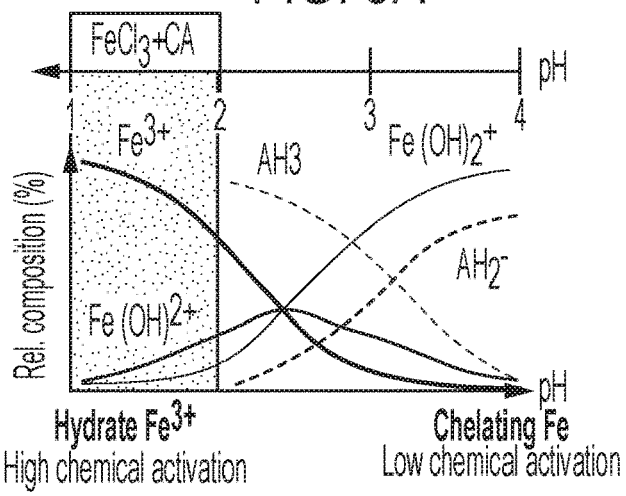
FIG. 9B illustrates relative composition ratio (%) of hydrate, chelating complex and Fe ions in water with different pH values; AH3 and AH$_2$— represent citric acid and protonated citric acid (losing one H), respectively, according to some embodiments.
Figure 9B:
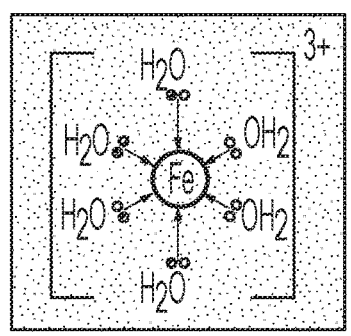
Figure 9B:
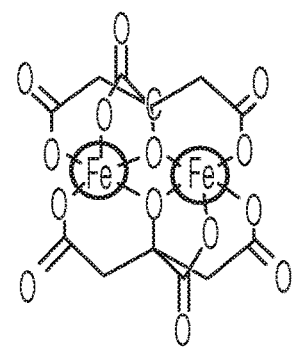

FIG. 9B illustrates relative composition ratio (%) of hydrate, chelating complex and Fe ions in water with different pH values; AH3 and $AH_2^-$ represent citric acid and protonated citric acid (losing one H), respectively. FIG. 9B illustrates relative composition ratios (%) of iron with different oxidation states of $Fe^{3+}$, $Fe(OH)^{2+}$, $Fe(OH)_2^+$, and citric acid in protonated ($AH_2^-$) and deprotonated ($AH_3$) forms in pHs ranging from 1 to 4 in water. By lowering pH, and limiting the Fe ion hydrolysis and citric acid chelation, more $Fe^{3+}$ (high chemical activation) contents form and participate in leaching, in contrast to chemically inactive Fe complexes that chelate with protonated citric acid in the higher pH region.

Example 7

Figure 10A:
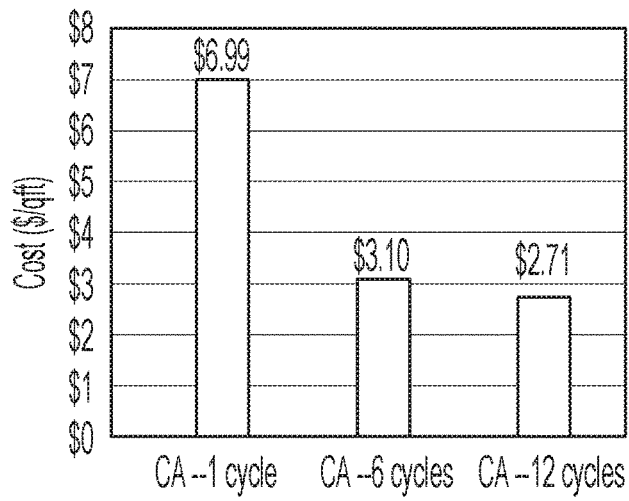
FIGS. 10A and 10B illustrates batch lifetime effects on total cost with various extend cycles (1, 6 and 12), according to some embodiments.
Figure 10B:
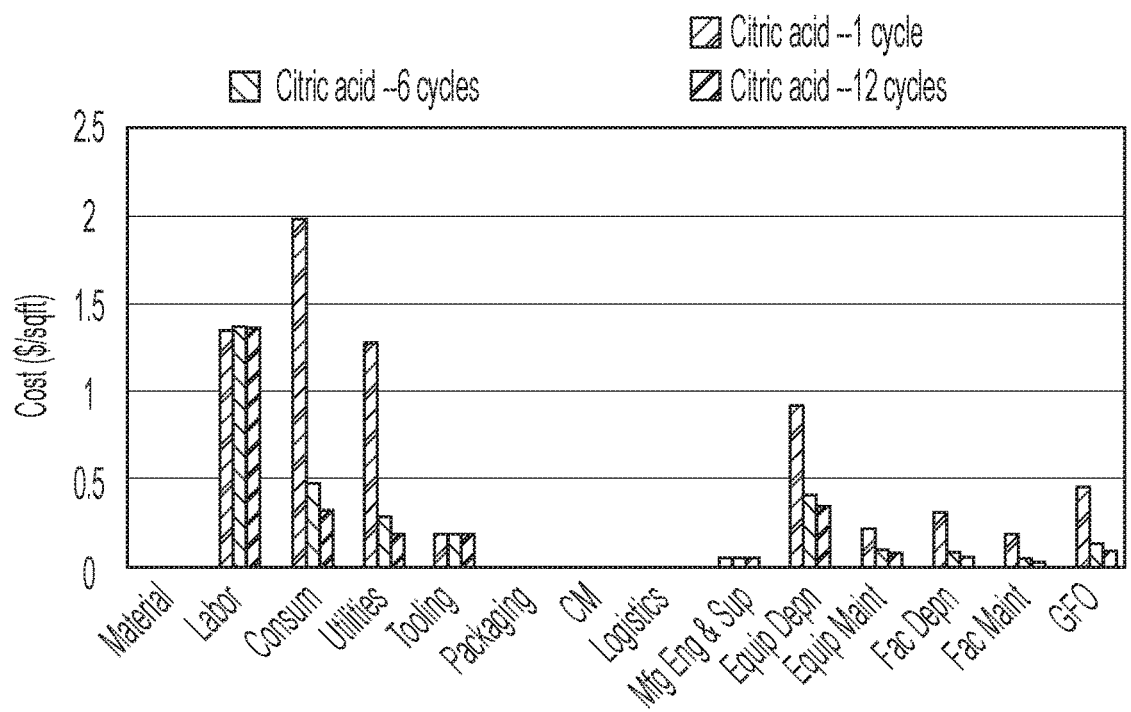

Practical effects of bath lifetime extension are shown in FIGS. 10A and 10B. For example, FIGS. 10A and 10B illustrate batch lifetime effects on total cost with various extend cycles (citric acid spiked; 1, 6 and 12). The extended bath lifetime results in reduced production costs. In a cost model simulation, production costs are reduced from $3.10/qft (when the bath lifetime is extended to six cycles) to $6.99/qft (when the bath lifetime is one cycle), as seen in FIG. 10A. An additional six cycles is able to decrease cost an additional $0.39 to $2.71/qft (when the bath lifetime is extended to 12 cycles).

This cost savings is mainly from energy consumption, labor, utilities expense, and equipment deployment (FIG. 10B). This cost model validates the importance of non-HF etching techniques applied in anti-glare production lines.

Example 8

Figure 11A:
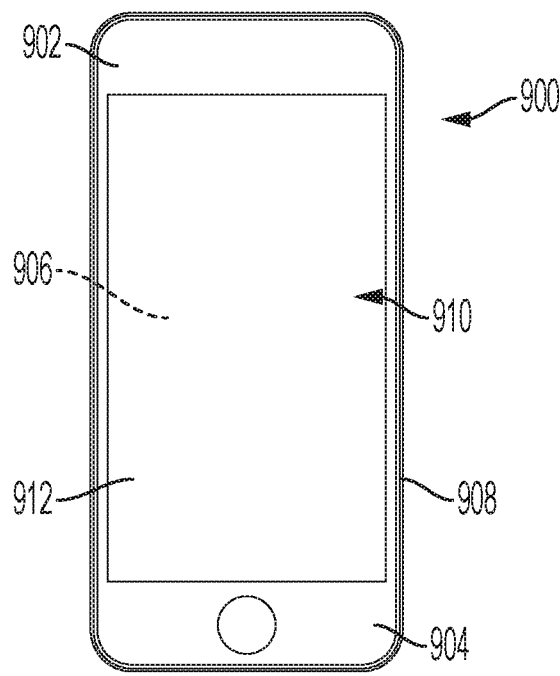
FIG. 11A is a plane view of an exemplary electronic device incorporating any of the articles disclosed herein and FIG. 11B is a perspective view of the exemplary electronic device of FIG. 11A, according to some embodiments.
Figure 11B:
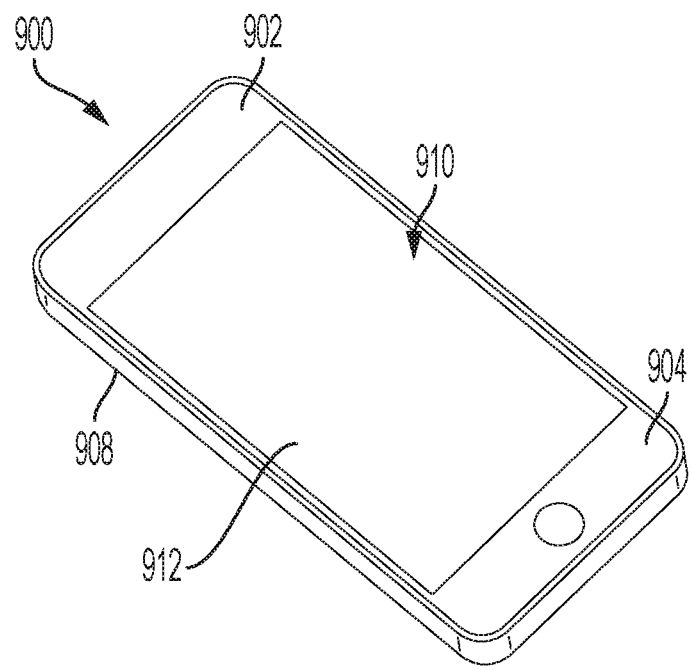

The glass articles disclosed herein may be incorporated into another article such as an article with a display (or display articles) (e.g., consumer electronics, including mobile phones, tablets, computers, navigation systems, and the like), architectural articles, transportation articles (e.g., automotive, trains, aircraft, sea craft, etc.), appliance articles, or any article that requires some transparency, scratch-resistance, abrasion resistance or a combination thereof. An exemplary article incorporating any of the glass articles disclosed herein, including glass articles 100a, 100b, is shown in FIGS. 11A and 11B. Specifically, FIGS. 11A and 11B show a consumer electronic device 900 including a housing 902 having front 904, back 906, and side surfaces 908; electrical components (not shown) that are at least partially inside or entirely within the housing and including at least a controller, a memory, and a display 910 at or adjacent to the front surface of the housing; and a cover substrate 912 at or over the front surface of the housing such that it is over the display. In some embodiments, at least one of the cover substrate 912 or a portion of housing 902 may include any of the glass articles disclosed herein.

Example 9

In addition to HCl and citric acid spiking, the spiking methods disclosed herein may also be applied to other mineral acids such as $H_2SO_4$ ($pK_a=-3$), $HNO_3$ ($pK_a=-1.37$), $HClO_4$ ($pK_a=-1.6$), $H_2CrO_4$ ($pK_a=-0.98$), HI ($pK_a=-10$), HBr ($pK_a=-9$), and the like, and/or strong organic acids, such as benzenesulfonic acid ($pK_a=-2.5$), methanesulfonic acid ($pK_a=-2.0$), 2-nitroaniline ($pK_a=-0.26$), dichloroacetic acid ($pK_a=1.25$), and the like.

Thus, as described herein, (1) HCl and $FeCl_3$ spiking approaches are described for improving leaching bath lifetime, which degrade significantly after each leaching batch reaction; (2) spiking approaches are cost effective and process friendly, allowing HCl/$FeCl_3$ additions during short intervals of two batches, with minor requirement additionally for temperature compensation and blending time; (3) significant benefits are seen in reducing production cost by lowering (i) leaching chemical consumption, (ii) batch ramp-up energy, and (iii) utility idle time waste; and (4) reactivated solution by the HCl/$FeCl_3$ spiking maintain surface texture in submicron scale to achieve low sparkle (i.e., low PPD) for the high density display applications.

In view of the present disclosure, one skilled in art will readily recognize the effectiveness of the respective disclosed HCl and $FeCl_3$ spiking approaches to relive degraded leaching solution, and consistently maintain surface texturing performance up to the 6$^{th}$ cycles. The disclosed spiking approach, jointed with the prior established leaching formula, mitigates the bath lifetime degradation (usually 40%-50% decay after each use). Further, the higher $H_3O^+$ and unchelated $Fe_3^+$ contents weaken solidity of the growing reposition layer and retain the leaching ability. In addition, the present disclosure offers process friendly and cost-effective advantages to be adopted in the production line for saving cost in chemical and energy consumption.

The present disclosure has many advantages some of which are as follows:

The present disclosure provides respective HCl and $FeCl_3$ spiking approaches for improving the leaching bath lifetime, which degrades significantly after each leaching batch reaction.

The spiking approach described herein is cost effective and process friendly, which allows HCl/$FeCl_3$ additions during a short interval of two batches, with minor requirement additionally for temperature compensation and blending time.

The present disclosure has significant benefits to reduce the production cost by lowering (1) the leaching chemical consumption, (2) the batch ramp up energy, and (3) the utility idle time waste.

As described herein, the reactivated solution by the HCl/ $FeCl_3$ spiking maintains surface texture in a submicron scale to achieve low sparkle (i.e. low PPDi) for the high density display applications.

Many variations and modifications may be made to the above-described embodiments of the disclosure without departing substantially from the spirit and various principles of the disclosure. All such modifications and variations are intended to be included herein within the scope of this disclosure and protected by the following claims.

What is claimed is:

1. A method of making a textured glass article, comprising:
    etching an initial primary surface of a glass substrate having a thickness with a hydrofluoric acid-free etchant having a pH of about 3 or less; and
    removing the etchant from the glass substrate,
    wherein:
        the etching is conducted from above ambient temperature to about 100° C. to form a textured region that is defined by a primary surface of the substrate and comprises a sparkle of 2% or less,
        the etching comprises a plurality of batch cycles, and one or more of:
            the hydrofluoric acid-free etchant is spiked with hydrochloric acid (HCl) after a second of the plurality of batch cycles and is not spiked with hydrochloric acid (HCl) between a first and the second of the plurality of batch cycles;
            the hydrofluoric acid-free etchant is spiked with citric acid following one or more of the plurality of batch cycles; or
            the hydrofluoric acid-free etchant is spiked with iron (III) chloride hexahydrate following one or more of the plurality of batch cycles.

2. The method of claim 1, wherein the hydrofluoric acid-free etchant comprises: at least one of hydrochloric acid (HCl), citric acid, or iron (III) chloride hexahydrate.

3. The method of claim 1, wherein the step of etching comprises an additive salt used with the hydrofluoric acid-free etchant.

4. The method of claim 3, wherein the additive salt comprises one or more cations selected from the group consisting of $NH_4^+$, $Al^{3+}$, $Fe^{3+}$, $Ca^{2+}$ and $Mg^{2+}$.

5. The method of claim 1, wherein the hydrofluoric acid-free etchant is spiked with hydrochloric acid (HCl) after the second of the plurality of batch cycles and is not spiked with hydrochloric acid (HCl) between the first and the second of the plurality of batch cycles.

6. The method of claim 5, wherein the spiking comprises at least 0.25 vol. % HCl by total volume of etchant.

7. The method of claim 1, wherein the hydrofluoric acid-free etchant is spiked with citric acid following one or more of the plurality of batch cycles.

8. The method of claim 7, wherein the spiking comprises at least 1.8 wt. % citric acid by total volume of etchant.

9. The method of claim 7, wherein a transmission haze of the glass substrate with citric acid spiking is greater than a transmission haze of the glass substrate without citric acid spiking after two batch cycles.

10. The method of claim 1, wherein the hydrofluoric acid-free etchant is spiked with iron (III) chloride hexahydrate following one or more of the plurality of batch cycles.

11. The method of claim 10, wherein the spiking comprises at least 3.5 wt. % iron (III) chloride hexahydrate by total volume of etchant.

12. The method of claim 10, wherein a transmission haze of the glass substrate with iron (III) chloride hexahydrate spiking is greater than a transmission haze of the glass substrate without iron (III) chloride hexahydrate spiking after two batch cycles.

13. The method of claim 1, wherein the etching comprises at least six batch cycles.

14. The method of claim 1, wherein the step of etching comprises:
    a first etching step to form an interim textured glass substrate having a first leached layer with a plateaued top surface; and
    a second etching step to form a secondary textured glass substrate having a second leached layer with a plurality of exposed features,
    wherein the plurality of exposed features have a first average feature size and a first average roughness.

15. The method of claim 14, wherein:
    the plurality of exposed features comprise a plurality of peaks and valleys;
    the first average feature size is a distance between adjacent peaks in a range of less than about 10 µm; and
    the first average roughness is a peak-to-valley distance in a range of 1 nm to 1000 nm.

16. The method of claim 15, further comprising:
    removing the second leached layer to form the textured glass article having a second average feature size and a second average roughness,
    wherein the second average feature size and the second average roughness is substantially equivalent to the first average feature size and the first average roughness.

17. The method of claim 1, wherein the glass substrate comprises a bulk composition at the midpoint of the thickness comprising about 40 mol % to 80 mol % silica and the textured region comprises a textured region composition comprising at least about 40 mol % silica.

18. The method of claim 17, wherein the textured region composition comprises a higher amount of silica than the silica in the bulk composition.

* * * * *